US008867021B2

(12) United States Patent
De Vries et al.

(10) Patent No.: US 8,867,021 B2
(45) Date of Patent: Oct. 21, 2014

(54) ILLUMINATION SYSTEM, LITHOGRAPHIC APPARATUS AND METHOD OF ADJUSTING AN ILLUMINATION MODE

(75) Inventors: Gosse Charles De Vries, Veldhoven (NL); Edwin Johan Buis, Belfeld (NL); Marinus Johannes Maria Van Dam, Venlo (NL); Jan Bernard Plechelmus Van Schoot, Eindhoven (NL); Fidelus Adrianus Boon, Bavel (NL); Hermanus Johannes Maria Kreuwel, Schijndel (NL)

(73) Assignee: ASML Netherlands B.V., Veldhoven (NL)

( * ) Notice: Subject to any disclaimer, the term of this patent is extended or adjusted under 35 U.S.C. 154(b) by 132 days.

(21) Appl. No.: 13/392,022

(22) PCT Filed: Mar. 18, 2010

(86) PCT No.: PCT/EP2010/053539
§ 371 (c)(1),
(2), (4) Date: Feb. 23, 2012

(87) PCT Pub. No.: WO2011/023419
PCT Pub. Date: Mar. 3, 2011

(65) Prior Publication Data
US 2012/0154777 A1    Jun. 21, 2012

Related U.S. Application Data

(60) Provisional application No. 61/236,789, filed on Aug. 25, 2009.

(51) Int. Cl.
*G03B 27/54* (2006.01)
*G03B 27/72* (2006.01)
*G03F 7/20* (2006.01)

(52) U.S. Cl.
CPC ........ *G03F 7/70116* (2013.01); *G03F 7/70075* (2013.01)
USPC .............................. 355/67; 355/71

(58) Field of Classification Search
CPC .................................................. G03F 7/70116
USPC ............ 355/52, 53, 55, 67–71; 359/291–292; 250/492.1–492.2
See application file for complete search history.

(56) References Cited

U.S. PATENT DOCUMENTS 6,040,935 A    3/2000  Michalicek
6,642,994 B2*  11/2003  Mori et al. ...................... 355/53
(Continued)

FOREIGN PATENT DOCUMENTS

CN        101025573       8/2007
JP        2003-022967     1/2003
(Continued)

OTHER PUBLICATIONS

International Preliminary Report on Patentability for corresponding PCT International Patent Application No. PCT/EP2010/053539, mailed Mar. 8, 2012.
(Continued)

*Primary Examiner* — Hung Henry Nguyen
(74) *Attorney, Agent, or Firm* — Pillsbury Winthrop Shaw Pittman LLP

(57) ABSTRACT

An illumination system is disclosed that had a plurality of moveable reflective elements and associated actuators which may be configured to form an illumination mode. One or more of the actuators is arranged to move between first, second and third positions, and so move an associated moveable reflective element between first, second and third orientations, the first and second orientations being such that radiation reflected from the moveable reflective element forms part of the illumination mode, and the third orientation being such that radiation reflected from the moveable reflective element does not form part of the illumination mode.

19 Claims, 13 Drawing Sheets

(56) References Cited

U.S. PATENT DOCUMENTS

| | | |
|---|---|---|
| 6,737,662 B2 | 5/2004 | Mulder et al. |
| 7,830,578 B2 * | 11/2010 | Branson et al. ............... 359/238 |
| 8,054,446 B2 * | 11/2011 | Kraus et al. .................... 355/30 |
| 2003/0038225 A1 | 2/2003 | Mulder et al. |
| 2006/0175556 A1 * | 8/2006 | Yabuki ....................... 250/492.1 |
| 2008/0239268 A1 | 10/2008 | Mulder et al. |
| 2010/0020300 A1 * | 1/2010 | Bouman et al. ................ 355/67 |
| 2012/0013882 A1 * | 1/2012 | Loopstra et al. ............... 355/67 |

FOREIGN PATENT DOCUMENTS

| | | |
|---|---|---|
| JP | 2006-216917 | 8/2006 |
| JP | 2008-258605 | 10/2008 |
| WO | 02/10836 A2 | 2/2002 |

OTHER PUBLICATIONS

International Search report for PCT International Patent Application No. PCT/EP2010/053539, mailed on Jun. 24, 2010.

* cited by examiner

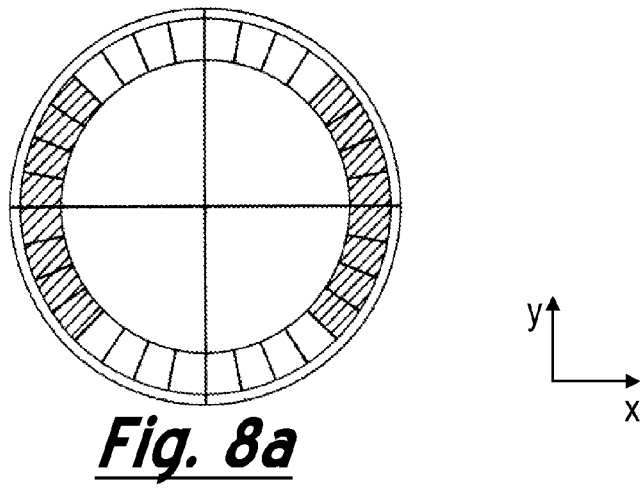
Fig. 8a
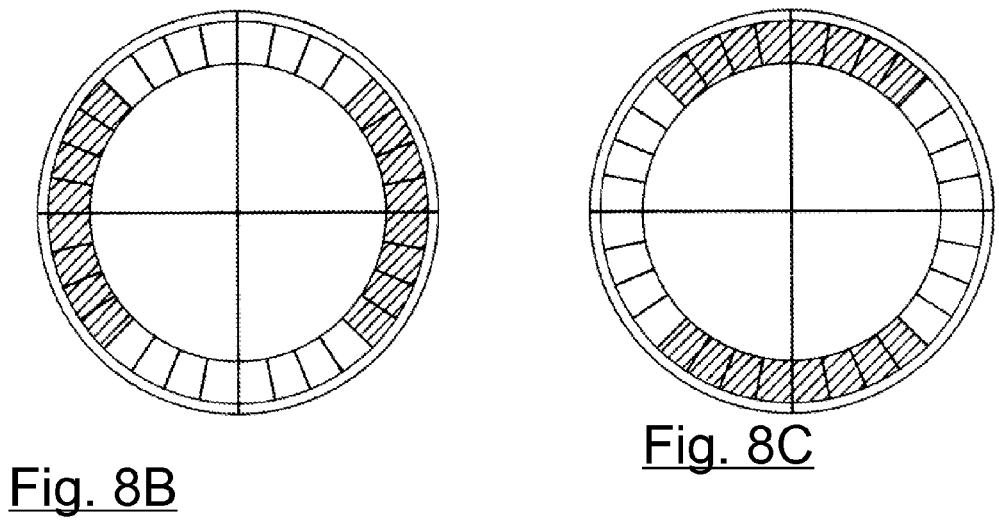
Fig. 8B
Fig. 8C
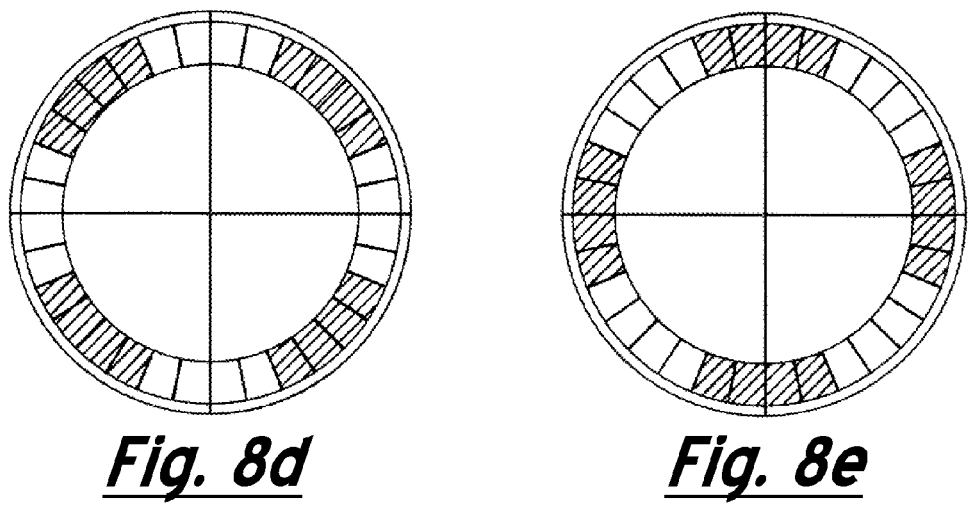
Fig. 8d
Fig. 8e

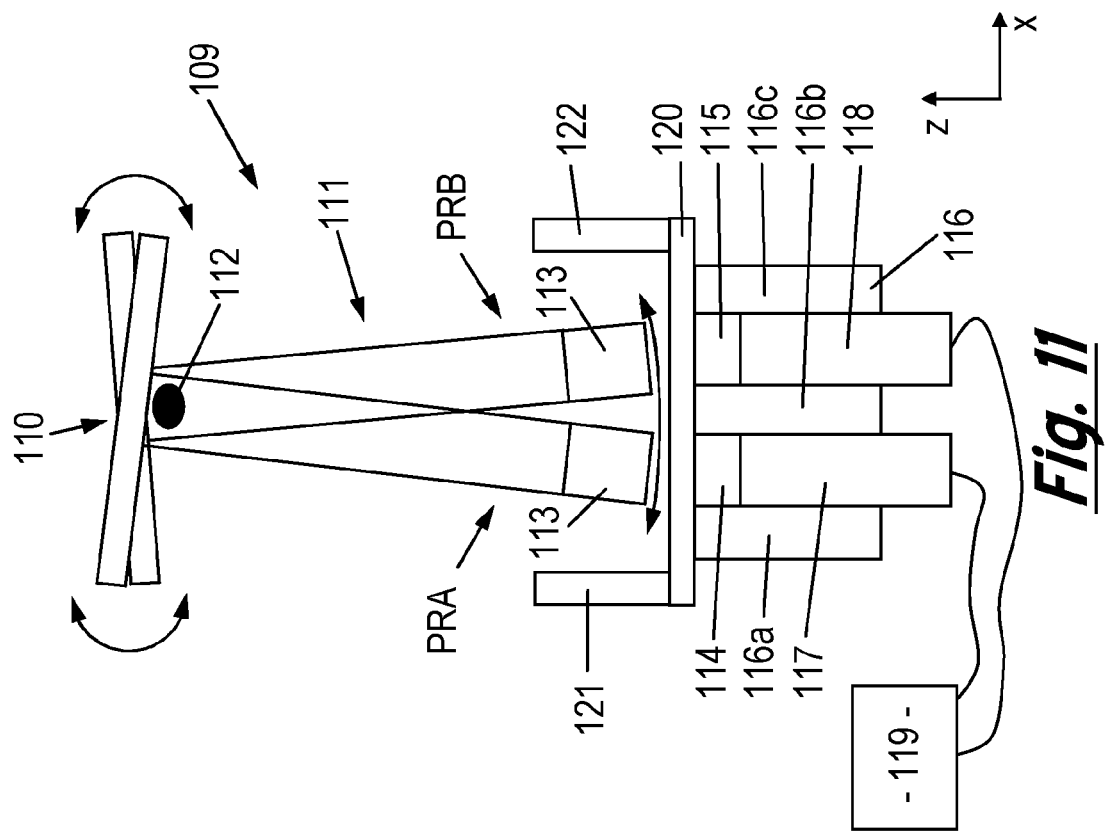
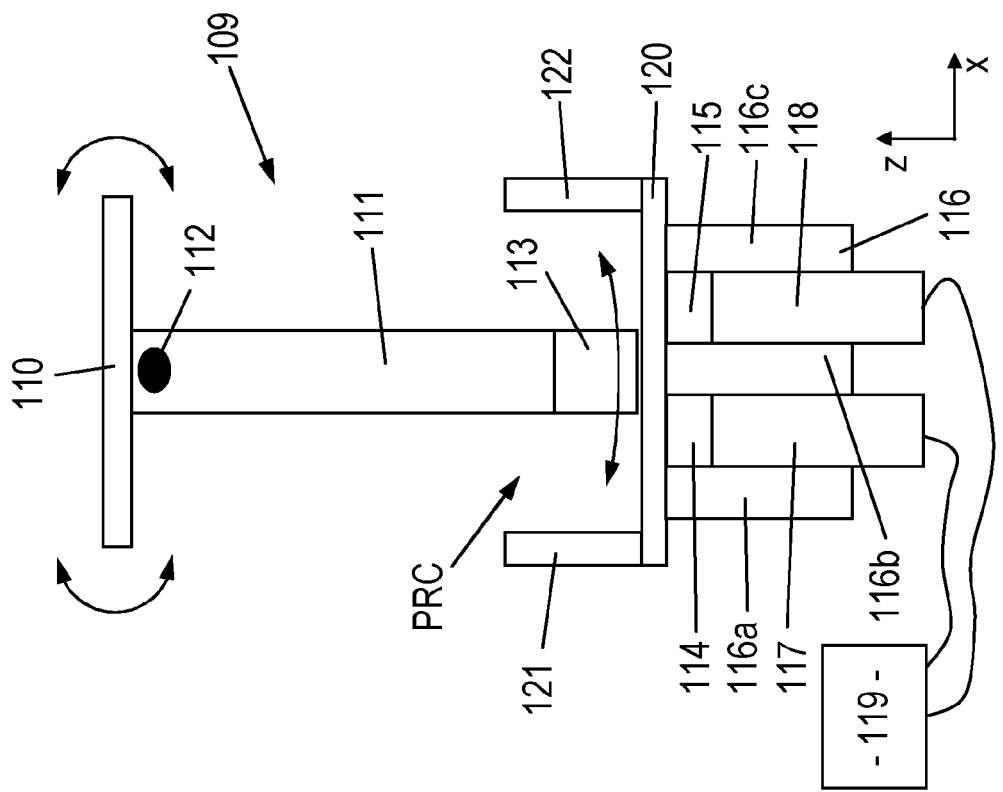

ILLUMINATION SYSTEM, LITHOGRAPHIC APPARATUS AND METHOD OF ADJUSTING AN ILLUMINATION MODE

CROSS-REFERENCE TO RELATED APPLICATIONS

This application is the United States national phase entry of PCT/EP2010/053539, filed Mar. 18, 2010, which claims the benefit of priority from U.S. Provisional Patent Application No. 61/236,789, filed on Aug. 25, 2009, the contents of both of which are incorporated herein in their entireties by reference.

FIELD

The present invention relates to an illumination system, a lithographic apparatus including the illumination system, and a method of adjusting an illumination mode.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC. This pattern can be transferred onto a target portion (e.g. comprising part of a die, one die, or several dies) on a substrate (e.g. a silicon wafer) Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through the beam in a given direction (the "scanning"-direction) while synchronously scanning the substrate parallel or anti-parallel to this direction.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

A lithographic apparatus generally includes an illumination system. The illumination system receives radiation from a source, for example an excimer laser or an extreme ultra violet radiation source, and provides a radiation beam (sometimes referred to as a "projection" beam) which is incident upon a patterning device. The radiation beam is patterned by the patterning device, and is then projected by a projection system onto a substrate.

It is known in the art of lithography that an image of the patterning device projected onto a substrate can be improved by providing the radiation beam with an appropriate illumination mode. An illumination mode is a spatial intensity distribution of the radiation beam in a pupil plane of the illumination system, centred with respect to an axis or optical axis of the illumination system. At the plane of the patterning device (a field plane of the illumination system) such a spatial intensity distribution corresponds to a distribution of angles of incidence of incident radiation, referred to as an angular intensity distribution of radiation. A desired illumination mode may, for example, be a conventional illumination mode having a central irradiated portion in the pupil plane or an off axis illumination mode having one or more isolated, off axis irradiated portions in the pupil plane. Accordingly, an illumination system of a lithographic apparatus typically includes an intensity distribution adjustment apparatus arranged to direct, shape and control the radiation beam in the illumination system such that a selected illumination mode can be achieved.

The prior art describes various intensity distribution adjustment apparatus arranged to control the illumination beam so as to achieve a desired illumination mode. For example, a zoom-axicon device (a combination of a zoom lens and an axicon) can be used to create an annular illumination mode, whereby the inner and outer radii of the annular intensity distribution in the pupil plane are controllable. The magnitude of the inner and outer radii is usually indicated by $\sigma_{inner}$ and $\sigma_{outer}$ respectively. These numbers represent respectively the ratio of the inner radius and the ration of the outer radius to the radius corresponding to the numerical aperture of the projection system. A zoom-axicon device generally comprises multiple refractive optical components that are independently movable. A zoom-axicon device is therefore not suitable for use with EUV radiation (e.g. radiation at 13.5 nm or with a wavelength between 5 and 20 nm), because radiation at these wavelengths is strongly absorbed as it passes through refractive materials.

Spatial filters may be used to create illumination modes. For example, a spatial filter with two opposite, off axis openings corresponding to a dipole illumination mode may be provided in a pupil plane of the illumination system in order to generate a dipole illumination mode. The spatial filter may be removed and replaced by a different spatial filter when a different illumination mode is required. However, spatial filters block a considerable proportion of the radiation beam, thereby reducing the intensity of the radiation beam when it is incident upon the patterning device. Known EUV sources struggle to provide EUV radiation at an intensity which is sufficient to allow a lithographic apparatus to operate efficiently. Therefore, it is not desirable to block a considerable portion of the radiation beam when forming the illumination mode.

SUMMARY

It is desirable to provide an illumination system and method which is capable of forming an illumination mode and is capable of adjusting the illumination mode.

According to an aspect, there is provided an illumination system comprising a plurality of moveable reflective elements and associated actuators which may be configured to form an illumination mode, wherein one or more of the actuators is arranged to move between first, second and third positions, and so move an associated moveable reflective element between first, second and third orientations, the first and second orientations being such that radiation reflected from the moveable reflective element forms part of the illumination mode, and the third orientation being such that radiation reflected from the moveable reflective element does not form part of the illumination mode.

According to an aspect, there is provided a lithographic apparatus comprising an illumination system having a plurality of moveable reflective elements and associated actuators which may be configured to form an illumination mode, wherein one or more of the actuators is arranged to move between first, second and third positions, and so move an associated moveable reflective element between first, second and third orientations, the first and second orientations being such that radiation reflected from the moveable reflective element forms part of the illumination mode, and the third orientation being such that radiation reflected from the moveable reflective element does not form part of the illumination mode.

According to an aspect, there is provided a method of adjusting an illumination mode formed by a plurality of moveable reflective elements, the method comprising changing the orientation of one or more moveable reflective elements such that radiation reflected from the one or more moveable reflective elements does not form part of the illumination mode.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 including

FIG. 6 including

FIG. 8 including FIGS. 8a, 8b, 8c, 8d, and 8e, shows a plurality of depicts five illumination modes which may be formed using the moveable reflective elements of the illumination system;

FIG. 9 including

FIGS. 10 and 11 show a moveable reflective element and actuator of the illumination system;

DETAILED DESCRIPTION

Figure 1:
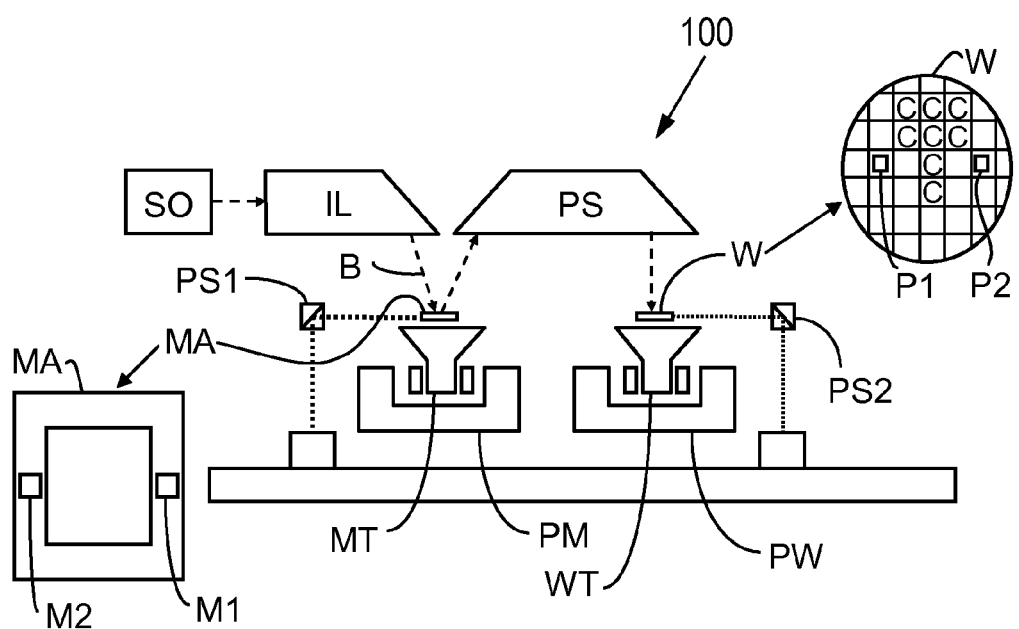
FIG. 1 schematically depicts a lithographic apparatus according to an embodiment of the invention.

FIG. 1 schematically depicts a lithographic apparatus 100 including a source collector module SO according to one embodiment of the invention. The apparatus comprises:
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the afore mentioned outer and/or inner radial extent (with values $\sigma_{outer}$ and $\sigma_{inner}$, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired intensity uniformity and angular intensity distribution in its cross-section, as incident on the patterning device.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As mentioned above, the illumination system IL comprises an intensity distribution adjustment apparatus. The intensity distribution adjustment apparatus is arranged to adjust the spatial intensity distribution of the radiation beam at a pupil plane in the illumination system, in order to control the angular intensity distribution of the radiation beam incident on the patterning device. The intensity distribution adjustment apparatus may be used to select different illumination modes at the pupil plane of the illumination system. Selection of an illumination mode may for example depend upon properties of a pattern which is to be projected from the patterning device MA onto the substrate W. The spatial intensity distribution of the radiation beam at the illumination system pupil plane is converted to an angular intensity distribution before the radiation beam is incident upon the patterning device (e.g. mask) MA. It is appreciated that there is a Fourier relationship between the pupil plane of the illumination system and the patterning device MA (the patterning device is in a field plane). The pupil plane of the illumination system is a Fourier transform plane of the object plane where the patterning device MA is located, and it is conjugate to a pupil plane of the projection system.

Figure 2A:
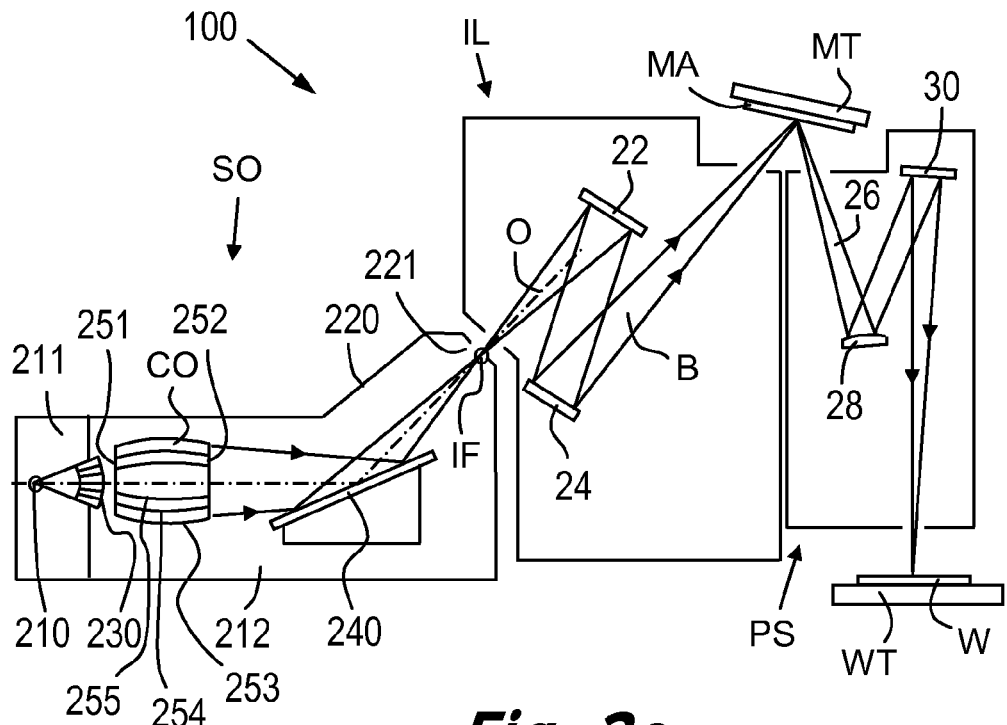
FIG. 2a schematically depicts part of the lithographic apparatus of FIG. 1 in more detail including a discharge produced plasma source.

FIG. 2a shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22, also referred to hereinafter as the first reflective component 22, and a facetted pupil mirror device 24, also referred to hereinafter as the second reflective component 24, arranged to provide a desired angular distribution of the radiation beam B, at the patterning device MA, as well as a desired uniformity of radiation intensity at the patterning device MA. The first reflective component 22 may be in a field plane of the illumination system IL, and the second reflective component 24 may be in a pupil plane of the illumination system. Upon reflection of the beam of radiation B at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2a.

Collector optic CO, as illustrated in FIG. 2a, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 2B:
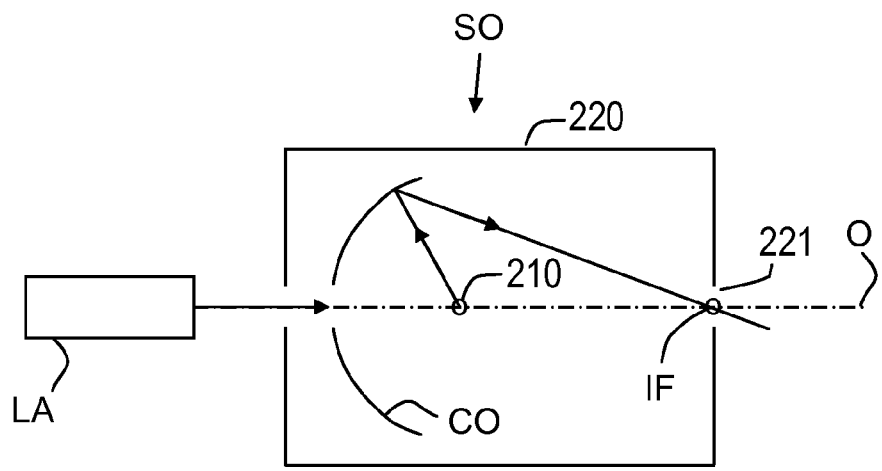
FIG. 2b schematically depicts part of the lithographic apparatus of FIG. 1 in more detail including a laser produced plasma source.

Alternatively, the source collector module SO may be part of an LPP radiation system as shown in FIG. 2b. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

Figure 3:
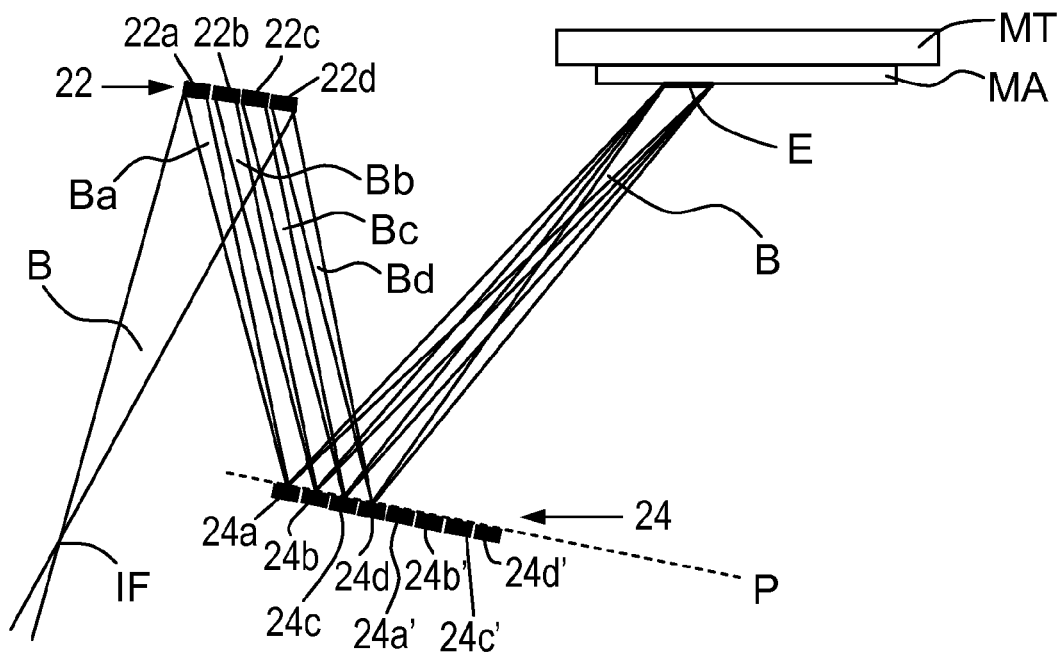
FIGS. 3 and 4 illustrate operation of moveable reflective elements of an illumination system of the lithographic apparatus.

FIG. 3 schematically shows part of the lithographic apparatus, including the first and second reflective components in more detail. The first reflective component 22 comprises a plurality of primary reflective elements including the primary reflective elements 22a, 22b, 22c and 22d. The second reflective component 24 comprises a plurality of secondary reflective elements including the secondary reflective elements 24a, 24b, 24c, 24d, and 24a', 24b', 24c', 24d'. Primary and secondary reflective elements may, hereinafter, also be referred to as field facet mirrors and pupil facet mirrors, respectively. The primary reflective elements 22a-d are configured to direct (reflect) radiation towards the secondary reflective elements 24a-d, a'-d'. Although only four primary reflective elements 22a-d are shown, any number of primary reflective elements may be provided. The primary reflective elements may be arranged in a two-dimensional array (or some other two-dimensional arrangement). Although only eight secondary reflective elements 24a-d, a'-d' are shown, any number of secondary reflective elements (the number being typically a multiple of the number of primary reflective elements) may be provided. The secondary reflective elements may be arranged in a two-dimensional array (or some other two-dimensional arrangement).

The primary reflective elements 22a-d have adjustable orientations, and may be used to direct radiation towards selected secondary reflective elements 24a-d, a'-d'.

The second reflective component 24 coincides with a pupil plane P of the illumination system IL or is disposed proximate to a pupil plane of the illumination system. The second reflective 24 component therefore acts as a virtual radiation source (also commonly referred to as a secondary radiation source) which directs radiation onto the patterning device MA. A further mirror (not shown) may be provided between the second reflective component 24 and the patterning device MA. The latter mirror may be a system of mirrors, and may be arranged to image the primary reflective elements 22a-d onto the plane wherein in use the patterning device MA is held by the substrate table MT.

The spatial intensity distribution of the radiation beam B at the second reflective component 24 defines the illumination mode of the radiation beam. Since the primary reflective elements 22a-d have adjustable orientations, they may be used to form different spatial intensity distributions at the pupil plane P, thereby providing different illumination modes.

In use, the radiation beam B is incident upon the primary reflective elements 22a-d of the first reflective component 22. Each primary reflective element 22a-d reflects a sub-beam of radiation towards a different, secondary reflective element 24a-d, a'-d' of the second reflective component 24. A first sub-beam Ba is directed by a first primary reflective element 22a to a first secondary reflective element 24a. Second, third and fourth sub-beams Bb, Bc and Bd are directed by second, third and fourth primary reflective elements 22b, 22c, and 22d respectively to second, third and fourth secondary reflective elements 24b, 24c, and 24d.

The sub-beams Ba-d are reflected by the secondary reflective elements 24a-d towards the patterning device MA. The sub-beams may together be considered to form a single radiation beam B which illuminates an illumination area E on the mask MA. The shape of the illumination area E is determined by the shape of the primary reflective elements 22a-d. In a scanning lithographic apparatus the illumination area E may for example be a rectangle or a curved band, which in the scanning direction has a width narrower than the width in a direction perpendicular to the scanning direction.

Each of the primary reflective elements 22a-d forms an image of the intermediate focus IF at a different secondary reflective element 24a-d, a'-d' of the second reflective component 24. In practice, the intermediate focus IF will be an image of the plasma source, the image having a finite diameter (e.g. 4-6 mm). Consequently, each primary reflective element 22a-d will form an image of the virtual source point IF which has a finite diameter (e.g. 3-5 mm) at the secondary reflective elements 24a-d, a'-d'. The secondary reflective elements 24a-d, a'-d' may each be arranged and constructed as a single pupil facet mirror having a diameter which is larger than the afore mentioned image diameter (to avoid radiation falling between secondary reflective elements and thereby being lost). The intermediate focus IF and images of the intermediate focus IF are shown as points in the figures for ease of illustration.

The primary reflective elements and the secondary reflective elements may have optical powers different from zero. For example, each primary reflective element 22a-d may form at or near an irradiated secondary reflective element a demagnified image of the virtual source point IF which is smaller than the virtual source point IF. Each one of the secondary reflective elements 24a-d, a'-d' may form an image of one of the primary reflective element 22a-d at or near the field plane wherein the patterning device is located during exposure of a substrate. These images are substantially overlapping and together form the illumination area E.

The orientation of the primary reflective elements 22a-d determines the illumination mode which is formed at the pupil plane P. For example, the primary reflective elements 22a-d may be oriented such that radiation sub-beams are directed at the four innermost secondary reflective elements 24c,d,a',b'. This would provide an illumination mode which could be considered to be a one-dimensional equivalent of a conventional (disk-shaped) illumination mode. Such a conventional illumination mode is characterized by an intensity distribution in the pupil plane having a portion with relatively high intensity which is centred at the optical axis O, surrounded by a portion of relatively low or even zero intensity, and may therefore be referred to, hereinafter, as a conventional "on axis" illumination mode. In an alternative example, the primary reflective elements 22a-d may be oriented such that radiation sub-beams are directed at two secondary reflective elements 24a-b at a left hand end of the second reflective component 24, and at two secondary reflective components 24c'-d' at a right hand end of the second reflective component. This would provide an illumination mode which could be considered to be a one-dimensional equivalent of, for example, an annular illumination mode. Such an illumination mode is characterized by an intensity distribution in the pupil plane having a portion with relatively low or even zero intensity which is centred at the optical axis O, surrounded by an area having at least one portion of relatively high intensity, and may therefore be referred to, hereinafter, as an "off axis" illumination mode.

Each of the primary reflective elements such as anyone of the elements 22a-d is configured such that it may be in one of two predetermined orientations: a first orientation and a second orientation. The first orientation is such that the primary reflective element reflects a sub-beam of radiation towards a selected secondary reflective element comprised within a first desired location on the second reflective component 24. The second orientation is such that the primary reflective element reflects the sub-beam of radiation towards a selected secondary reflective element comprised within a second desired location on the second reflective component 24. Further, each of the primary reflective elements such as any one of the field facets 22a-d illustrated in FIG. 3 is moveable between its associated first orientation and second orientation. Further, according to an aspect of the invention, each of the primary reflective elements such as anyone of the elements 22a-d is configured such that it may be in a third orientation, as is described further below.

To indicate that a field facet mirror in its first orientation irradiates, in use, a particular pre-selected secondary reflective element which is specifically selected from the plurality of secondary reflective elements, reference is made hereinafter to a first "associated" secondary reflective element. Similarly, reference is made to the second "associated" secondary reflective element, it being the element irradiated when the field facet mirror is in its second orientation. Similarly, aforementioned first and second desired locations are also referred to, hereinafter as the first and second "associated" locations.

Figure 4:
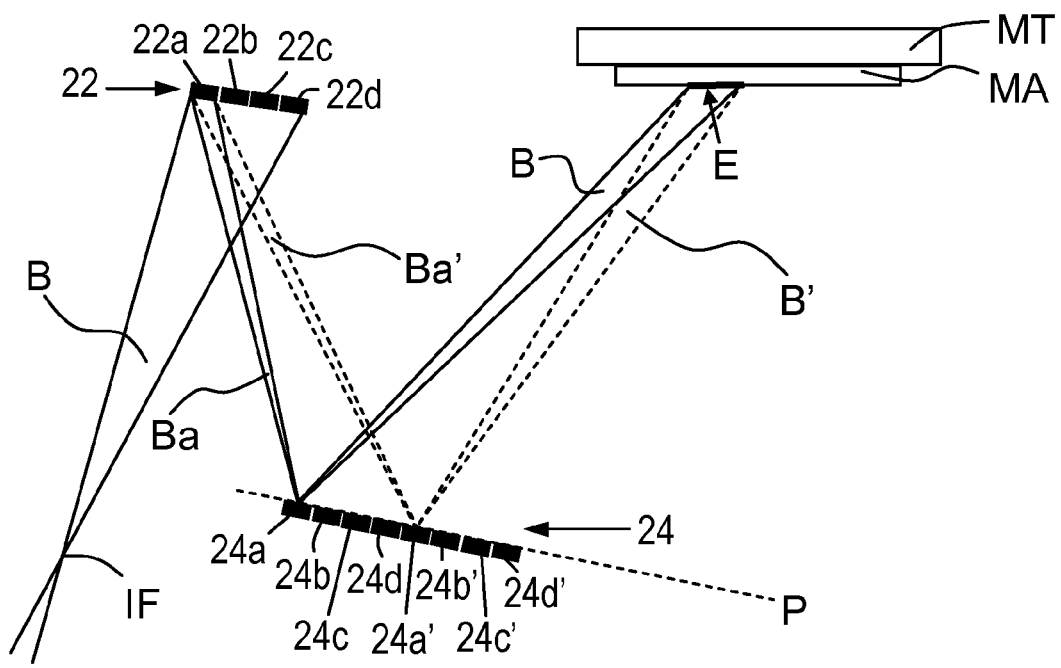

FIG. 4 illustrates the movement of a primary reflective element between first and second orientations, using as an example the first primary reflective element 22a of the first reflective component 22. When the first primary reflective element 22a is in a first orientation, it directs a radiation sub-beam Ba towards a first secondary reflective 24a of the second reflective component 24. When the first primary reflective element 22a is in a second orientation, it directs a radiation sub-beam Ba' (shown with dotted lines) towards a second secondary reflective 24a' of the second reflective component 24. The corresponding first and second locations are not shown explicitly in FIG. 4. In FIG. 4 the first and second locations may be assumed to coincide with the locations occupied by the first and second secondary reflective elements 24a and 24a' respectively. However, the first and second locations may be separate areas in the pupil plane P, and may each include a plurality of secondary reflective elements, as will be discussed in detail further below.

Each primary reflective element of a group of primary reflective elements such as the group of elements 22a-d may be arranged to direct a radiation sub-beam to a first location and a second location associated with each primary reflective element 22a-d, the first and second location being different and unique with respect to locations which receive radiation sub-beams from other primary reflective elements not belonging to the said group of primary reflective elements such as the group of elements 22a-d. By configuring each primary reflective element 22a-d appropriately, radiation may be directed towards the requisite locations at the second reflective component 24 so as to produce spatial intensity distributions which correspond with desired illumination modes.

Although FIGS. 3 and 4 show only four primary reflective elements 22a-d, the first reflective component 22 may comprise many more primary reflective elements. The first reflective component 22 may comprise for example up to 100, up to 200 or up to 400 primary reflective elements. The first reflective component 22 may comprise for example any number in the range of 100-800 primary reflective elements. The reflective elements may be mirrors. The first reflective component 22 may comprise an array of 1024 (e.g. 32×32) mirrors, or 4096 (e.g. 64×64) mirrors, or any suitable number of mirrors. The primary reflective elements may be arranged in a two-dimensional grid-like formation. The primary reflective elements may be arranged in a plane which crosses through the radiation beam.

The first reflective component 22 may comprise one or more arrays of primary reflective elements. For example, the primary reflective elements may be arranged or grouped to form a plurality of arrays, each array for example having 32×32 mirrors. In the text, the term "array" may mean a single array or a group of arrays.

The secondary reflective elements 24a-d, a'-d' may be mounted such that the orientations of the secondary reflective elements are fixed with respect to a mounting surface of the second reflective component.

Figure 5A:
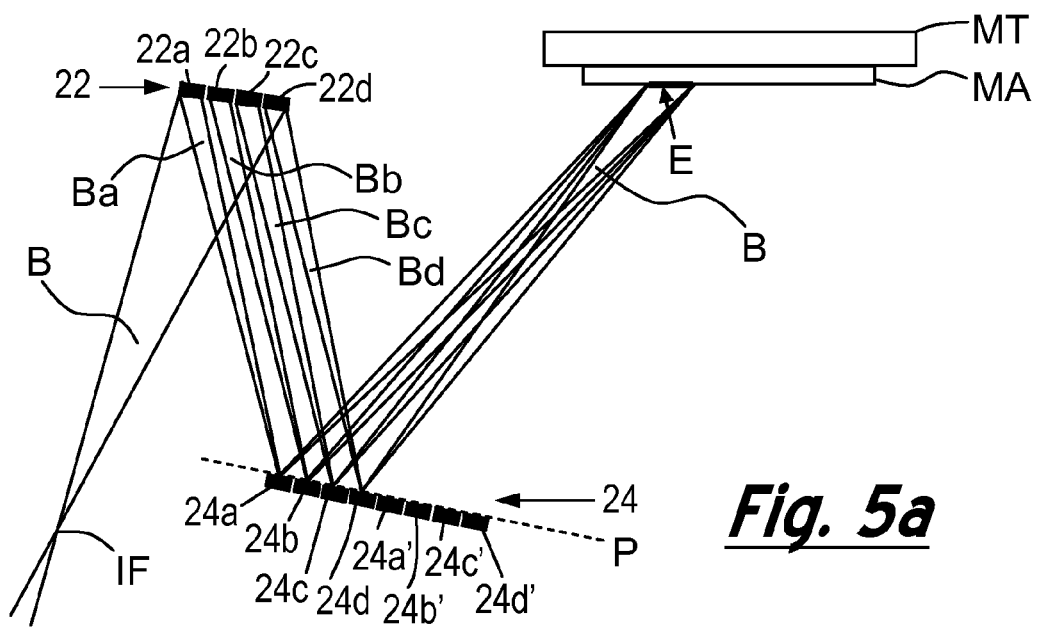
FIG. 5a and FIG. 5b illustrate operation of moveable reflective elements of an illumination system of the lithographic apparatus, and resulting illumination modes.
Figure 5B:
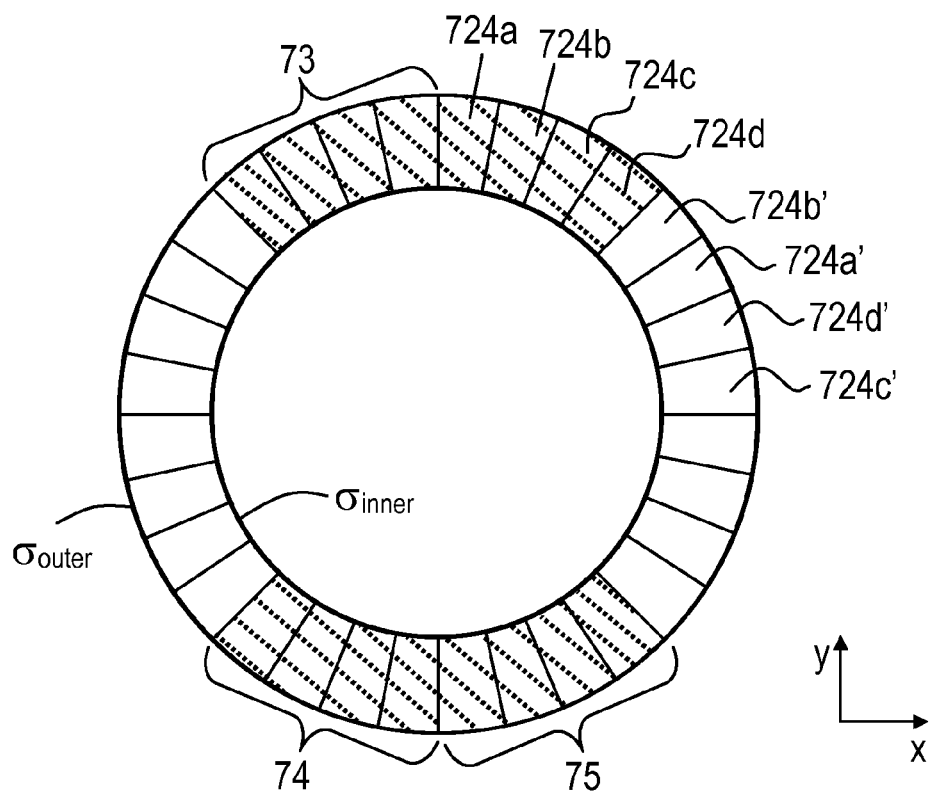
Figure 6A:
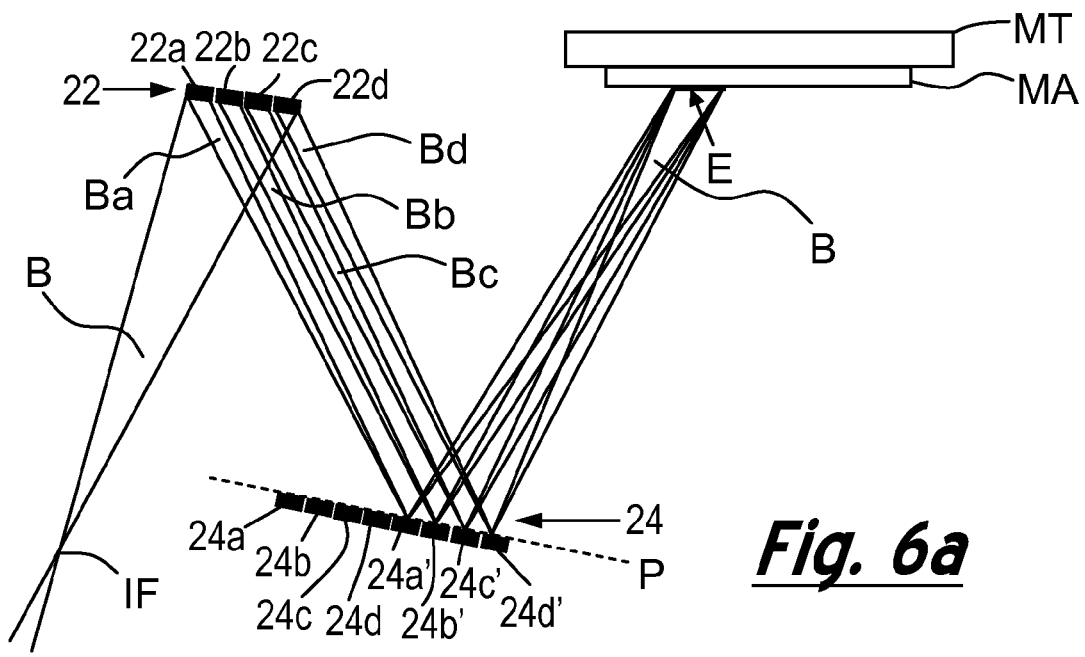
FIG. 6a and FIG. 6b illustrate operation of moveable reflective elements of an illumination system of the lithographic apparatus, and resulting illumination modes
Figure 6B:
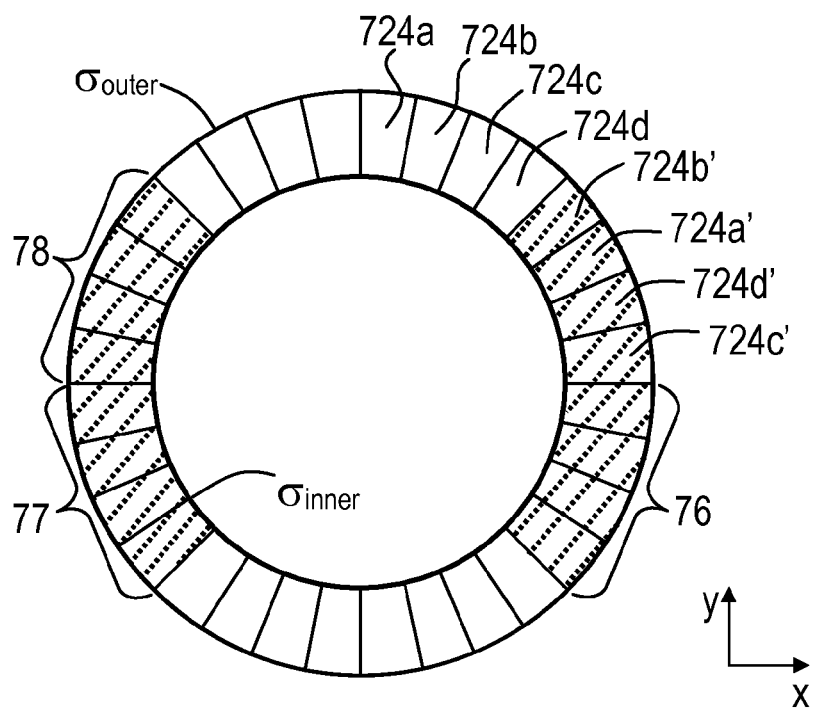

FIGS. 5 and 6 schematically illustrate the principle of redirecting radiation in order to change a spatial intensity distribution at the pupil plane P, and thereby obtain a desired illumination mode. The drawing planes of FIGS. 5b and 6b coincide with the pupil plane P shown in FIGS. 5a and 6a. Cartesian coordinates are indicated in FIGS. 5b and 6b in order to facilitate explanation of the figures. The indicated Cartesian coordinates are not intended to imply any limitation on the orientation of the spatial intensity distributions that may be obtained using the invention. The radial extent of the spatial intensity distributions is defined by $\sigma_{inner}$ (inner radial extent) and $\sigma_{outer}$ (outer radial extent). The inner and outer radial extents may be circular, or may have some other shape.

As explained above, the spatial intensity distribution (and hence illumination mode) of the radiation beam in the pupil plane P is determined by the orientations of the primary reflective elements such as the elements 22a-d. For example, an illumination mode may be provided and controlled by selecting and then moving each of the primary reflective elements 22a-d to either its first orientation or its second orientation as required.

In this example there are 16 primary reflective elements, only 4 of which are shown in FIGS. 5a and 6a (the primary reflective elements 22a-d). When the primary reflective elements 22a-d are in their respective first orientations, sub-beams Ba, Bb, Bc and Bd of radiation are reflected towards associated first locations 724a, 724b, 724c and 724d, as shown in FIG. 5b. These locations respectively comprise the secondary reflective elements 24a, 24b, 24c and 24d, shown in FIGS. 5a and 6a. Referring to FIG. 5b, the first locations 724a-d are at or close to the top of the figure. Other primary reflective elements (not illustrated) are also in their first orientations, and direct sub-beams of radiation to groups 73, 74, and 75 of adjacent first locations, which are at or close to the top of the figure, and at or close to the bottom of FIG. 5b. Locations which receive sub-beams of radiation are shaded using dotted lines. It can be seen from FIG. 5b that when the primary reflective elements 22a-d are in their first orientations and the other primary reflective elements (not illustrated) are also in their first orientations, a dipole illumination mode is formed in which the poles are separated in the y-direction.

When the primary reflective elements 22a-d are in their second orientations, sub-beams of radiation are reflected towards associated second locations 724a', 724b', 724c', and 724d', as shown in FIG. 6b. These locations respectively comprise the secondary reflective elements 24a', 24b', 24c' and 24*d'*, shown in FIGS. 5*a* and 6*a*. Referring to FIG. 6*b*, the second locations 724*a'*-d' are at or close to the right hand side of the figure. The afore mentioned other primary reflective elements are also in their second orientations, and direct sub-beams of radiation to groups 76, 77, and 78 of adjacent second locations, which are at or close to the right hand side of the figure, and at or close to the left hand side of the figure. Locations which receive sub-beams of radiation are shaded using dotted lines. It can be seen from FIG. 6*b* that when the primary reflective elements 22*a*-d and the other primary reflective elements are in their second orientations, a dipole illumination mode is formed in which the poles are separated in the x-direction.

Switching from the y-direction dipole illumination mode to the x-direction dipole illumination mode includes moving each of the primary reflective elements 22*a*-d from the first orientation to the second orientation. Similarly, switching from the x-direction dipole illumination mode to the y-direction dipole illumination mode includes moving each of the primary reflective elements 22*a*-d from the second orientation to the first orientation.

Formation of other illumination modes may include moving some of the primary reflective elements 22*a*-d to their first orientation and some to their second orientation, as is explained further below. The first and second locations associated with each primary reflective element and the corresponding first orientation and second orientation of each primary reflective element may be chosen so as to maximise the number of useful illumination modes that can be produced.

The primary reflective elements may be moved between first orientations and second orientations by rotating them about predetermined axes. The primary reflective elements may be moved using one or more actuators.

One or more primary reflective elements may be configured to be driven to rotate around the same predetermined axis. One or more other primary reflective elements may be configured to be driven to rotate around one or more other axes.

In an embodiment, a primary reflective element comprises an actuator arranged to move the primary reflective element between the first orientation and the second orientation. The actuator may for example be a motor. The first and second orientations may be defined by end stops. A first end stop may comprise a mechanical apparatus which prevents the primary reflective element from moving beyond the first orientation. A second end stop may comprise a mechanical apparatus which prevents the primary reflective element from moving beyond the second orientation.

Since movement of the primary reflective element is limited by end stops, the primary reflective element can be accurately moved to the first orientation or the second orientation without needing to monitor the position of the primary reflective element (e.g. without needing to use one or more position monitoring sensors and a feedback system). The primary reflective elements may be oriented sufficiently accurately that they may form illumination modes of sufficient quality to be used in lithographic projection of a pattern from a patterning device onto a substrate.

A driver signal supplied to the actuator may be a binary signal. There is no need to use a more complex signal such as a variable analog voltage or a variable digital voltage, since the actuator only needs to move the primary reflective element to a first end stop or to a second end stop. The use of a binary (two-valued) driver signal for the actuator, rather than a more complex system, allows a more simple control system to be used than would otherwise be the case.

The apparatus described above in relation to FIGS. 5 and 6 includes 16 primary reflective elements and 32 locations on the second reflective component 24. In practice, many more primary reflective elements may be provided. However, 16 primary reflective elements is a sufficient number to allow illustration of the way in which several different illumination modes may be obtained. The following illumination modes may be obtained using 16 primary reflective elements associated with respective 32 locations on the second reflective component 24: annular, c-quad, quasar, dipole-y and dipole-x. These illumination modes are formed by configuring the 16 primary reflective elements so as to appropriately direct radiation towards a desired selection of 16 of the 32 associated locations at the pupil plane of the illumination system. It is appreciated that the locations on the second reflective component 24 can effectively be specified and indicated as locations at the pupil plane of the illumination system, since the reflective surfaces of the pupil facet mirrors of the second reflective component 24 are disposed at or proximate to the pupil plane. For the sake of simplicity, no distinction is made hereinafter between a "location" on the second reflective component and a "location" at the pupil plane of the illumination system.

Figure 7:
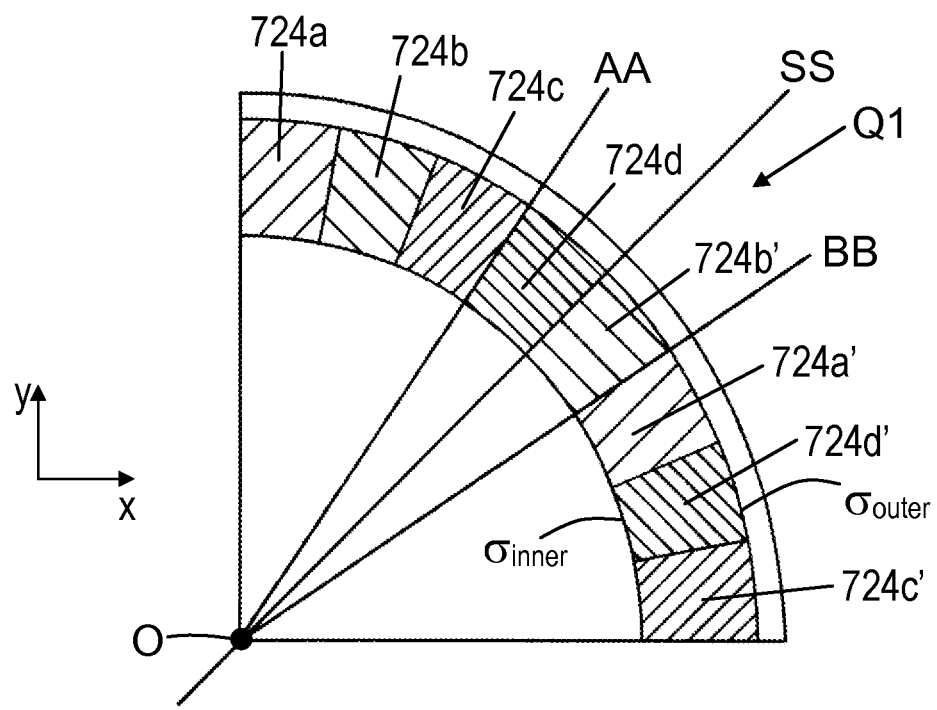
FIG. 7 depicts a first quadrant of a pupil plane.

FIG. 7 depicts a first quadrant Q1 of a pupil plane in an illumination system comprising a number of locations arranged in an annular shape circumferentially around an optical axis O intersecting the pupil plane. The illumination system is configured to produce the five different desired illumination modes. The locations 724*a*-d, 724*a'*-d' of the quadrant may receive radiation sub-beams Ba, Bb, Bc and Bd from the respective first reflective elements 22*a*-d. An inner radial extent of the locations is labelled as $\sigma_{inner}$. An outer radial extent of the locations is labelled as $\sigma_{outer}$. For simplicity, in FIG. 7 it is assumed that each location can be associated with just one secondary reflective element. In FIG. 7, the locations 724*a*-d, 724*a'*-d' are associated with the secondary reflective elements 24*a*-d, and the secondary reflective elements 24*a'*-d', respectively. The arrangement need not be circular.

It is appreciated, however, that alternatively a plurality of secondary reflective elements may be associated with each location. For example between 10 and 20 secondary reflective elements may be provided at each location. Where this is the case, the number of primary reflective elements scales accordingly. For example, if there are 10 secondary reflective elements at a given location, then there are 10 primary reflective elements arranged to direct radiation to that location (each of the primary reflective elements being arranged to direct radiation to a different secondary reflective element within the location). In the following description, where the term 'primary reflective element' is used, this may encompass a plurality of primary reflective elements which are configured to move in unison.

The relative surface area of locations across the pupil plane, i.e., the surface area of the constituent locations normalized by the pupil area corresponding to the numerical aperture of the projection lens, amounts to $(\sigma_{outer}^2 - \sigma_{inner}^2)/2$. Thus, the etendue ratio X which is defined as the inverse of the used pupil area follows as $X = 2/(\sigma_{outer}^2 - \sigma_{inner}^2)$.

In the quadrant Q1 depicted in FIG. 7, there are 8 locations including the respective 8 secondary reflective devices 24*a*-d, 24*a'*-d' (corresponding with 32 locations across the entire pupil plane). Each location is sized and shaped to be illuminated by a sub-beam of radiation reflected by a primary reflective element. Each primary reflective element is configured so as to separately illuminate two different locations from different parts of the same quadrant. More specifically, each primary reflective element is configured to move between a first orientation and a second orientation so as to direct radiation and thereby illuminate either a first associated location or a second associated location in the same quadrant, and hence to irradiate either a first associated secondary reflective element or a second associated secondary reflective element.

Although pairs of locations 724*a,a'*, 724*b,b'*, 724*c,c'* and 724*d,d'* are provided in the same quadrant Q1 in FIG. 7, it is not necessary that this is the case. For example, a first location may be provided in one quadrant, and the corresponding second location may be provided in a different quadrant. If the separation between the first and second locations of a pair of locations is increased, then the amount of rotation required by the primary reflective element in order to direct a radiation sub-beam to those locations will also increase. The positions of the locations may be selected such that the required rotation of the primary reflective elements is reduced or minimised, or that none of the primary reflective elements is required to rotate by more than a maximum rotation. The positions of the locations may be such that a desired set of illumination modes may be obtained (for example as explained further below in relation to FIG. 8).

A first primary reflective element 22*a* (see FIGS. 5 and 6) is configured to illuminate a first associated location 724*a* of the quadrant Q1 when orientated in a first orientation, and a second associated location 724*a'* of the quadrant when orientated in a second orientation. A second primary reflective element 22*b* is configured to illuminate a first associated location 724*b* when orientated in a first orientation and a second associated location 724*b'* when orientated in a second orientation. A third primary reflective element 22*c* is configured to illuminate a first associated location 724*c* when orientated in a first orientation and a second associated location 724*c'* when orientated in a second orientation. A fourth primary reflective element 22*d* is configured to illuminate a first associated location 724*d* when orientated in a first orientation and a second associated location 724*d'* when orientated in a second orientation.

An equivalent arrangement of the locations and associated primary reflective elements may apply for other quadrants (not illustrated).

Each primary reflective element may be moved between the first orientation and second orientation by rotating it about a certain axis. A plurality of primary reflective elements may be configured and arranged to be rotatable about the same axis. For example, pairs of primary reflective elements associated with pairs of adjacent locations in the same quadrant of the pupil plane may be configured so as to rotate about the same axis. In the illustrated example, the first and second primary reflective elements 22*a*, 22*b* associated with the pair of adjacent locations 724*a* and 724*b*, are configured to rotate about a first axis AA, and the third and fourth primary reflective elements 22*c*, 22*d* associated with the pair of adjacent locations 724*c* and 724*d*, are configured to rotate about a second axis BB. The first axis AA is arranged at 56.25° with respect to the x-axis in quadrant Q1, and the second axis BB is arranged at 33.75° with respect to the x-axis in quadrant Q1. Although the first and second axes AA, BB are shown in the plane of FIG. 7, this is for ease of illustration only. The axes are at or near the plane of the first reflective component 22, and more specifically at or near a plane containing pivot points of pairs of primary reflective elements 22*a,b* and 22*c,d*.

Additionally or alternatively, primary reflective elements associated with corresponding locations in opposing quadrants of the pupil plane may be configured to rotate about the same axis. For example, primary reflective elements 22*a,b* associated with the first quadrant Q1 and corresponding primary reflective elements associated with a third quadrant may be configured to rotate about the first axis AA. Likewise, primary reflective elements 22*c,d* associated with the first quadrant Q1 and corresponding primary reflective elements associated with the third quadrant may be configured to rotate about the second axis BB.

Primary reflective elements associated with a second quadrant, and primary reflective elements associated with a fourth quadrant, may be rotated about a third axis (e.g. arranged at 123.75° with respect to the x axis). In addition, primary reflective elements associated with the second quadrant and primary reflective elements associated with the fourth quadrant may be rotated about a fourth axis (e.g. arranged at 146.25° with respect to the x axis). Neither of these quadrants are shown in FIG. 7.

The primary reflective elements may be configured to rotate in the same direction or opposite directions about same axis.

When primary reflective elements are grouped together to rotate about the same axis, and to rotate in the same direction, an actuator arranged to move the primary reflective elements between their first and second orientations may be simplified. For example, an actuator associated with primary reflective elements that are grouped to rotate about the same axis may be arranged to move those primary reflective elements in unison. Thus, in an embodiment in which there are four predetermined axes of rotation, there may be four actuators.

FIG. 8 shows how five different illumination modes may be formed at the pupil plane of the illumination system, using the described apparatus (i.e. using 16 primary reflective elements and 4 axes of rotation). The illumination modes are as follows: annular illumination mode (FIG. 8*a*), dipole-x illumination mode (FIG. 8*b*), dipole-y illumination mode (FIG. 8*c*), quasar illumination mode (FIG. 8*d*) and c-quad illumination mode (FIG. 8*e*).

To produce the annular illumination mode, as shown in FIG. 8*a*, the primary reflective elements 22*a-d* associated with the first quadrant are oriented such that locations 724*b*, 724*d*, 724*a'* and 724*c'* are illuminated. This is achieved by rotating the first primary reflective element 22*a* around the first axis AA to its second orientation, rotating the second primary reflective element 22*b* around the first axis AA to its first orientation, rotating the third primary reflective element 22*c* around the second axis BB to its second orientation, and rotating the fourth primary reflective element 22*d* around the second axis BB to its first orientation. The primary reflective elements associated with the locations of the second, third and fourth quadrants are similarly orientated.

To produce a dipole-x illumination mode, as shown in FIG. 8*b* (see also FIG. 6*b*), the primary reflective elements associated with the first quadrant are orientated such that locations 724*b'*, 724*a'*, 724*d'* and 724*c'* are illuminated. This is achieved by rotating the first primary reflective element 22*a* around the first axis AA to its second orientation, rotating the second primary reflective element 22*b* around the first axis AA to its second orientation, rotating the third primary reflective element 22*c* around the second axis BB to its second orientation, and rotating the fourth primary reflective element 22*d* around the second axis BB to its second orientation. The primary reflective elements associated with the locations of the second, third and fourth quadrants are similarly orientated.

To produce a dipole-y illumination mode, as shown in FIG. 8*c* (see also FIG. 5*b*), the primary reflective elements associated with the first quadrant are orientated such that locations 724*a*, 724*b*, 724*c* and 724*d* are illuminated. This is achieved by rotating the first primary reflective element 22*a* around the first axis AA to its first orientation, rotating the second primary reflective element 22b around the first axis AA to its first orientation, rotating the third primary reflective element 22c around the second axis BB to its first orientation, and rotating the fourth primary reflective element 22d around the second axis BB to its first orientation. The primary reflective elements associated with the locations of the second, third and fourth quadrants are similarly orientated.

To produce a quasar illumination mode, as shown in FIG. 8d, the primary reflective elements associated with the first quadrant are orientated such that locations 724c, 724d, 724b' and 724a' are illuminated. This is achieved by rotating the first primary reflective element 22a around the first axis AA to its second orientation, rotating the second primary reflective element 22b around the first axis AA to its second orientation, rotating the third primary reflective element 22c around the second axis BB to its first orientation, and rotating the fourth primary reflective element 22d around the second axis BB to its first orientation. The primary reflective elements associated with the locations of the second, third and fourth quadrants are similarly orientated.

To produce a c-quad illumination mode, as shown in FIG. 8e, the primary reflective elements associated with the first quadrant are oriented such that locations 724a, 724b, 724d' and 724c' are illuminated. This is achieved by rotating the first primary reflective element 22a around the first axis AA to its first orientation, rotating the second primary reflective element 22b around the first axis AA to its first orientation, rotating the third primary reflective element 22c around the second axis BB to its second orientation and rotating the fourth primary reflective element 22d around the second axis BB to its second orientation. The primary reflective elements associated with the locations of the second, third and fourth quadrants are similarly orientated. In any of the above examples it is appreciated that illumination of a location (on the secondary reflective component) includes directing a sub beam of radiation to the corresponding secondary reflective element.

In the above description of the illumination modes shown in FIG. 8, it has been mentioned that the primary reflective elements associated with the locations of the second, third and fourth quadrants are orientated similarly to the first quadrant. The following explains the manner in which this is done. It can be seen from FIG. 8 that the dipole, quasar and c-quad modes are symmetric about the x and y axes. The annular mode of FIG. 8a however is not symmetric about the x and y axes, although it is rotationally symmetric (for rotations of 90° or multiples thereof).

According to an aspect of the invention it is appreciated that, when desired illumination modes do not share a same symmetry, the positions of the locations may be arranged such that each pair of locations has an associated pair of locations, and the two pairs are symmetric about a line SS which bisects the quadrant (see FIG. 7). For example, the first pair of locations 724a,a' is associated with the third pair of locations 724c,c'. These two pairs are symmetric about the line SS. The second pair of locations 724b,b' is associated with the fourth pair of locations 724d,d'. These two pairs are also symmetric about the line SS. The same constraint is applied to the other quadrants.

The second quadrant is a mirror image of the first quadrant. The third and fourth quadrants are mirror images of the first and second quadrants. Positioning the locations in this manner allows all of the illumination modes shown in FIG. 8 to be achieved. When any of the illumination modes shown in FIGS. 8b-d are to be produced, the orientations of corresponding primary reflective elements for each quadrant are the same. When the annular mode of FIG. 8a is to be produced, the orientations of the primary reflective elements for the first and third quadrants are opposite to those applied to the primary reflective elements for the second and fourth quadrants.

Although the above Figures show only a small number of primary reflective elements, a significantly larger number of primary reflective elements may be used. The first reflective component 22 may comprise for example up to 100, up to 200, up to 400 or more primary reflective elements. The primary reflective elements may be arranged in a two-dimensional grid-like formation. The primary reflective elements may be arranged in a plane which crosses through the radiation beam. Each primary reflective element may direct radiation towards a small portion of a given location. For example, referring to FIG. 7, the first location 724a may be subdivided into a plurality of portions (e.g. tens of portions), each of which receives radiation from a different primary reflective element.

The primary reflective elements may be mirrors, or any other suitable reflective elements.

Figure 9A:
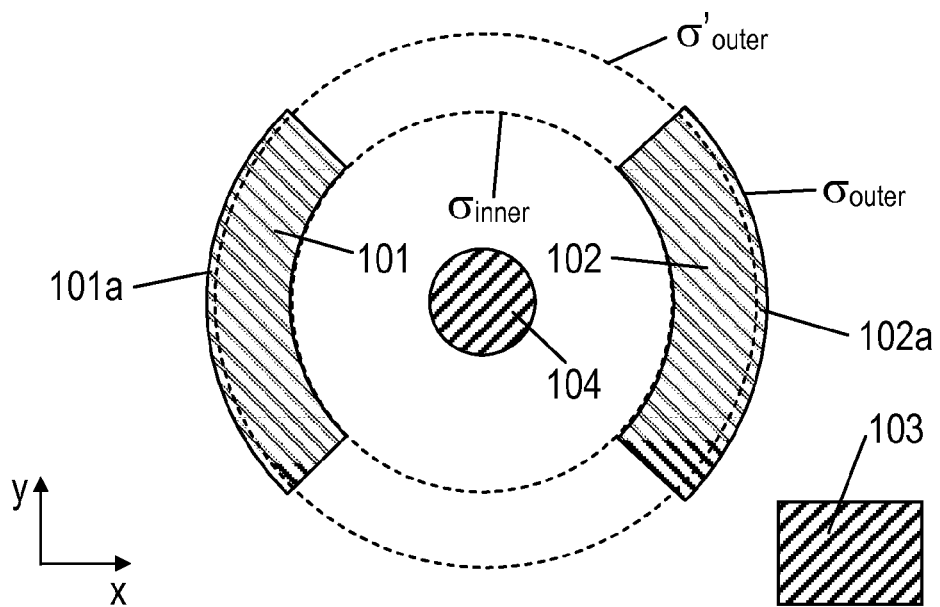
FIGS. 9a and 9b depicts adjustment of an illumination mode.

In some instances it may be desired to adjust the illumination mode. Referring to FIG. 9a, a dipole-x illumination mode comprising a left-hand pole 101 and a right-hand pole 102 is shown. It may be desired to adjust the illumination mode such that $\sigma_{outer}$ is reduced to a value $\sigma'_{outer}$ indicated by the dotted line. This may be achieved according to an embodiment of the invention by rotating those primary reflective elements which direct radiation to portions of the dipole mode 101a, 102a which fall outside of $\sigma_{outer}$, such that that radiation is directed away from the illumination mode. The radiation does not then form part of the illumination mode. For example, the primary reflective elements may be orientated such that they direct radiation towards a beam-dump which is provided outside of the illumination mode 103. The beam dump 103 is formed from a material which is absorbent to the radiation, and absorbs the radiation which is incident upon it.

Figure 9B:
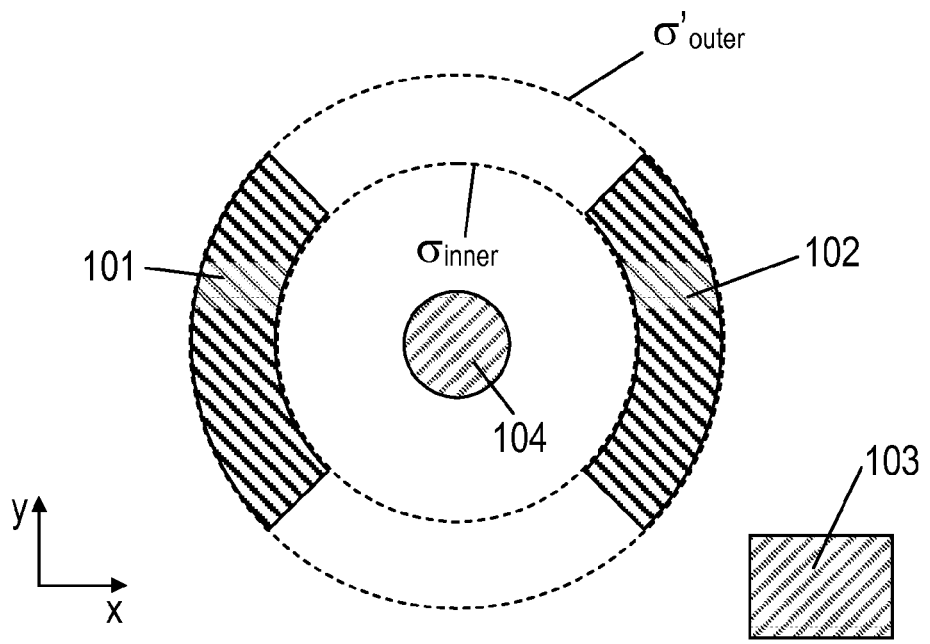

FIG. 9b shows the result of adjusting the illumination mode. The poles 101, 102 of the dipole now fall within $\sigma'_{outer}$. Radiation which had previously formed part of the illumination mode outside of σouter is now directed to the beam dump 103 and does not form part of the illumination mode.

The orientation to which the primary reflective elements are moved in order to direct radiation such that it does not form part of the illumination mode will be referred to as the third orientation. Thus, a given primary reflective element can either be in a first orientation which directs radiation to a first location which forms part of the illumination mode, a second orientation which directs radiation to a second location which forms part of the illumination mode, or a third orientation which directs radiation such that it does not form part of the illumination mode (e.g. by directing radiation away from the illumination mode).

Although only one beam dump is shown in FIG. 9, several beam dumps may be provided outside of the illumination mode. The beam dumps may be provided at locations which are spread out around the periphery of the maximum extent of the illumination mode. The beam dump(s) may have any suitable shape.

In an additional or alternative arrangement unwanted radiation may be directed by the primary reflective elements towards a beam dump 104 provided at the center of the plane in which the illumination mode is formed. This may be done for example if $\sigma_{inner}$ has a sufficiently large non-zero value that an unused region at the center of the pupil exists in which the beam dump 104 may be provided. The beam dump 104 is formed from a material which is absorbent to the radiation, and absorbs the radiation which is incident upon it. Although the illustrated beam dump 104 is round, it may have any suitable shape.

Each of the beam dumps 103, 104 may be replaced by a reflector which is arranged to direct unwanted radiation away from the patterning device MA (see FIG. 2), such that the radiation is not received by the projection system PL and is not transmitted onto the substrate W. The reflector may, for example, direct the unwanted radiation towards one or more radiation absorbent walls of the illumination system IL.

In a further arrangement, the unwanted radiation is directed towards secondary reflective elements which are oriented such that radiation which is reflected from the secondary reflective elements is not incident upon the patterning device MA (see FIG. 2). The radiation thus does not form part of the illumination mode. The radiation is not received by the projection system PL and is not transmitted onto the substrate W. The secondary reflective elements may for example direct the unwanted radiation towards one or more radiation absorbent walls of the illumination system IL.

A given secondary reflective element may be configured such that if it receives radiation from the primary reflective element which is associated with it then it reflects that radiation towards the patterning device MA, but if it receives radiation from a different primary reflective element then it reflects that radiation away from the patterning device MA. Referring to FIGS. 3 and 4 for example, a first sub-beam Ba is directed by a first primary reflective element 22a to a first secondary reflective element 24a or to a second secondary reflective element 24a'. The first and second secondary reflective elements reflect the sub-beam Ba towards the patterning device MA. If the first primary reflective element 22a were to direct the sub-beam Ba towards a different secondary reflective element, then that secondary reflective element would reflect the sub-beam away from the patterning device MA. It may be the case that a given secondary reflective element will only reflect radiation towards the patterning device MA if that radiation is received from a particular primary reflective element. It may be the case that a given secondary reflective element will reflect radiation away from the patterning device unless that radiation is received from a particular primary reflective element. This may be achieved via suitable selection of the angle of orientation of the secondary reflective element.

In this description, references to reflecting radiation towards the patterning device are not intended to mean that no optical components are present between the secondary reflective element and the patterning device. For example, the radiation may be reflected by the secondary reflective element via an optical component (e.g. an additional reflective element).

FIG. 10 shows an actuator 109 for a mirror 110 according to an embodiment of the invention. The mirror 110 is one of the aforementioned plurality of primary reflective elements of the reflective component 22 shown in FIG. 3. In particular, the mirror 110 may be one of the primary reflective elements 22a-d. The actuator may be used to rotate the mirror 110 between first and second orientations, and also to rotate the mirror to a third orientation in which radiation is directed away from the illumination mode.

The actuator 109 comprises a rod 111 on which the mirror 110 is provided, the rod being rotatably mounted on a pivot 112. Double-headed arrows in FIG. 10 show the direction of rotation of the rod 111 and the mirror 110. The rod 111 is resiliently biased by one or more springs (not shown) towards the orientation shown in FIG. 10 (i.e. the third position).

A permanent magnet 113 is located at the lowermost end of the rod 111. This magnet is hereafter referred to as the rod magnet 113. A pair of permanent magnets 114, 115 are held in a yoke 116. The permanent magnets 114, 115 are hereafter referred to as the first fixed magnet 114 and the second fixed magnet 115. A first coil 117 is located beneath the first fixed magnet 114, and a second coil 118 is located beneath the second fixed magnet 115. The first and second coils 117, 118 are connected to a controller 119 which is configured to control the supply of current to the first and second coils.

The yoke 116 has three poles 116a-c. The yoke may be made from iron, or any other suitable material (e.g. any ferroelectric material).

A sheet of non-magnetic material 120 is located over the first and second fixed magnets 114, 115 and over the poles 116a-c of the yoke 116. The sheet 120 forms part of a box within which the fixed magnets 114, 115 and yoke are held. The box prevents contamination, arising for example from outgassing from the fixed magnets or yoke, from passing into other parts of the lithographic apparatus. The sheet does not significantly affect the magnetic fields provided by the magnets 113-115 and coils 117, 118. The sheet 120 may be, for example, of stainless steel.

The mirror 110 and actuator 109 shown in FIG. 10 are one of a plurality of primary reflective elements and actuators. A primary reflective element and actuator (not shown) will be provided to the left of the illustrated mirror 110 and actuator 109, and another primary reflective element and actuator (not shown) will be provided to the right of the illustrated primary reflective element and actuator. Magnetic screens 121, 122 are provided at the left and right hand ends of the actuator 109 in order to screen the actuator from magnetic fields generated by adjacent actuators.

When no current is applied to the coils 117, 118, and the rod magnet 113 is equidistant between the first and second fixed magnets 114, 115, then the net magnetic force acting upon the rod magnet is zero. In addition, the resilient bias of the rod biases the rod towards the position shown in FIG. 10. Since there is zero net force acting upon the rod magnet 113 and rod 111, this is an equilibrium position in which the rod 111 may rest (as shown in FIG. 10). The equilibrium position of the rod 111 corresponds with the third orientation of the mirror 110 referred to above (i.e. the orientation which directs radiation away from the illumination mode), and is referred to hereafter and in FIG. 10 as the third position PRC of the rod. For simplicity, hereinafter, no distinction is made between a position of the rod 111 and a position of the rod magnet 113.

FIG. 11 shows the rod 111 in first and second positions PRA and PRB, which correspond to first and second orientations of the mirror 110. When the first coil 117 is energized (i.e. current is passed through the first coil), the force which attracts the rod magnet 113 to the first fixed magnet 114 is greater than the force which attracts the rod magnet to the second fixed magnet 115. The rod magnet thus moves towards the first fixed magnet 114 until its movement is stopped by an end stop (not shown). This moves the rod 111 to the first position and the mirror 110 to the first orientation. The first coil 117 may subsequently be de-energized. Since the rod magnet 113 is closer to the first fixed magnet 114 than the second fixed magnet 115, the force which attracts the rod magnet to the first fixed magnet is greater than the force which attracts the rod magnet to the second fixed magnet. Consequently, the rod magnet 113 remains in the first position, and the mirror 110 remains in the first orientation.

If it is desired to move the mirror 110 to the second orientation, then the second coil 118 is energized. The force exerted by the second coil 118 and second fixed magnet 115 is greater than the force exerted by the first fixed magnet 114. The rod magnet 113 therefore moves towards the second coil 118. Movement of the rod 111 continues until it is stopped by an end stop (not shown). The rod 111 thus moves to the second position, and the mirror 110 moves to the second orientation. The second coil 118 may subsequently be de-energized. Since the rod magnet 113 is closer to the second fixed magnet 115 than the first fixed magnet 114, the force which attracts the rod magnet to the second fixed magnet is greater than the force which attracts the rod magnet to the first fixed magnet. Consequently, the rod magnet 113 remains in the second position, and the mirror 110 remains in the second orientation.

It may be the case that the force exerted by the energized second coil 118 is not sufficiently great to overcome the force exerted by the first fixed magnet 114 when the rod magnet 113 is in the first position. If this happens then an additional force may be used to move the rod magnet 113 away from the first fixed magnet 114. The additional force may be generated by temporarily energizing the first coil 117 such that the first coil generates a repulsive force that pushes the rod magnet 113 away. This may be achieved by passing a current through the first coil 117 in an opposite direction to the direction which is used to generate an attractive force at the first coil. The second coil 118 can be similarly operated to facilitate movement of the rod magnet 113 to the first position.

Figure 12:
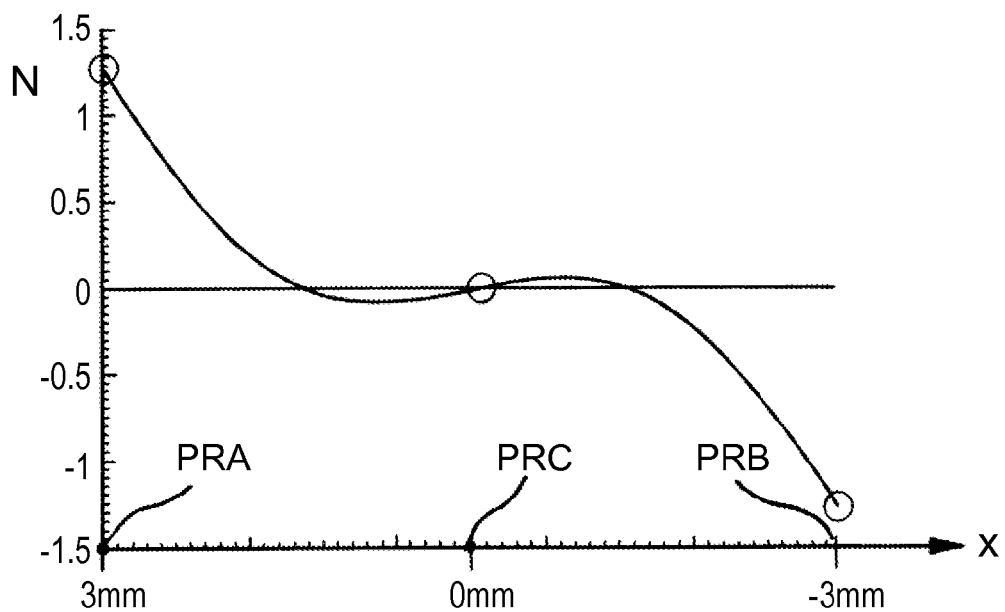
FIGS. 12 and 13 are graphs which show force exerted by magnets of the actuator.

FIG. 12 is a graph which shows a result of a simulation of the apparatus shown in FIGS. 10 and 11. The graph in FIG. 12 is a force curve showing the force in N which was generated by the fixed magnets 114, 115 when no current was supplied to the coils 117, 118 as a function of position in mm along an x-axis of the rod 111. The aforementioned equilibrium position of the rod 111 and the rod magnet 113 is positioned at x=0 mm in FIG. 12. First, second and third positions PRA, PRB and PRC, respectively, and respective associated forces are indicated by three respective circles in FIG. 12. It can be seen from FIG. 12 that when neither the first coil 117 nor the second coil 118 are energized, the rod magnet 113 may be in any of the three indicated positions. In the first position, the rod has been drawn towards the first fixed magnet 114 but is prevented from moving any further by an end stop. In the second position the rod magnet 113 is attracted to the second fixed magnet 115, but is prevented from moving any further by a different end stop.

It can be seen in FIG. 12 that there is an inflection in the middle of the force curve. The third position PRC is at the center of this inflection point. The inflection provides a range of starting positions from which the first and second fixed magnets 114, 115 will cause the rod magnet 113 to move to the third position. The left-hand and right-hand points at which the force curve crosses the zero force axis are the outer limits of this range. If the rod magnet 113 lies within this range, then it will move to the third position. The rod magnet 113 will then remain in the third position, since there is a zero net force acting upon the rod magnet.

As mentioned further above, the rod 111 is resiliently biased by one or more springs (not shown) towards the third position PRC. This means that in practice, the range of starting positions from which the rod 111 and rod magnet 113 will move to the third position is greater than the range indicated in FIG. 12.

Figure 13:
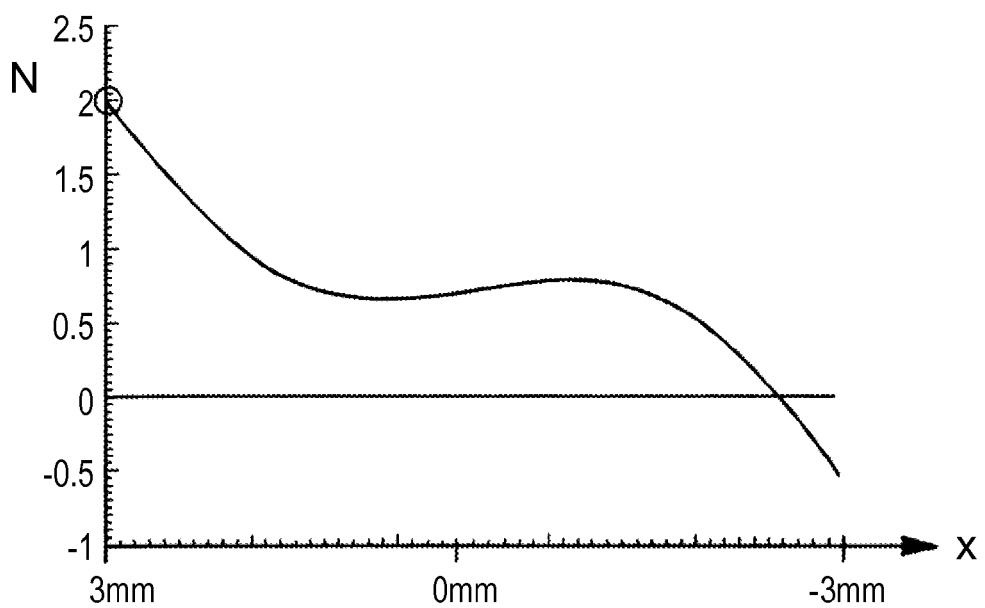

FIG. 13 shows the same simulation as FIG. 12, but with the first coil 117 energized (i.e. current is passing through the first coil). Energizing the first coil 117 has the effect of moving the force curve upwards. It can be seen that for most starting positions of the rod magnet 113, the rod magnet is drawn towards the first position by the combination of forces exerted by the first fixed magnet 114 and the first coil 117. If the rod magnet 113 starts in the second position, then the force exerted by the first fixed magnet 114 and the first coil 117 is not sufficient to move the rod magnet 113 to the first position. However, in this example, if the resilient bias exerted on rod 111 by the one or more springs is greater than 0.6 N, then total force acting on the rod will be sufficiently strong to move the rod away from the second position and to the first position.

The de-energizing of the first coil 117 and energizing the second coil 118 will cause the force curve to move downwards. The force provided by the second coil 118 and the second fixed magnet 115, together with the resilient bias exerted on the rod 111 by the one or more springs, is sufficiently strong to move the rod away from the first position to the second position.

One way in which the rod 111 may be moved from the second position (or first position) to the third position is as follows. A pulse of current is supplied to the second coil 118 such that the second coil repels the rod magnet 113. At the same time, a pulse of current is supplied to the first coil 117 such that the first coil attracts the rod magnet 113. The pulses of current initiate movement of the rod 111, such that the rod leaves the second position. Once the rod has gained some velocity and moved away from the second position, the current pulses may be switched off. Inertia may sustain movement of the rod away from the second position. The rod will pass the outermost starting position from which the rod 111 will move to the third position (the starting positions are explained further above). The rod 111 will then move to the third position. Decaying oscillations of the rod may occur before the rod 111 is at rest in the third position.

The current which is applied to the first and second coils 117, 118 may be adjusted in order to reduce the speed at which the rod 111 is incident upon end stops (not shown). Referring to FIG. 13 for example, the force curve indicates that the force acting on the rod magnet 113 when the first position is reached is considerable. The rod 111 may thus still be accelerating when it is incident upon the end stop. However, the current applied to the first coil 117 may be modified when the rod 111 is approaching the first position, the modification being such that a negative force is applied to the rod 111 thereby causing the rod to decelerate. This reduces the speed at which the rod 111 is incident upon the end stop, thereby providing the rod 111 with a 'softer landing'. Reducing the speed at which the rod 111 is incident upon the end stop reduces the likelihood that particles of contamination are emitted from the rod or the end stop.

Figure 14:
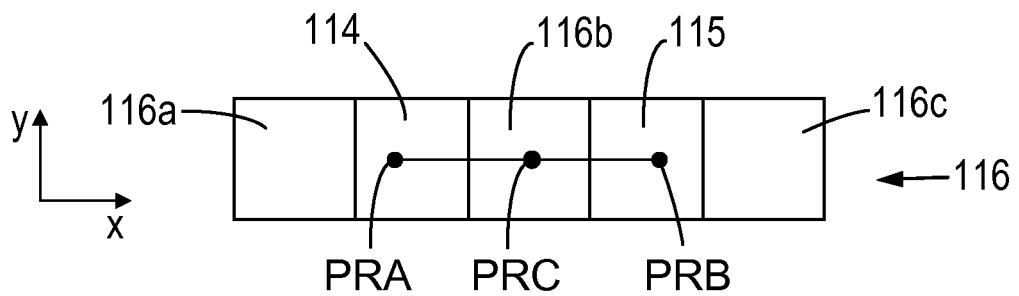
FIG. 14 shows part of the actuator viewed from above.

FIG. 14 shows, viewed from above, the three poles 116a-c of the yoke 116, and first and second fixed magnets 114, 115. The first position PRA, second position PRB and third position PRC of the rod magnet (not shown) are also indicated. It can be seen that the first, second and third positions PRA, PRB, and PRC are linked together by a straight line. When the first, second and third positions PRA, PRB, and PRC are linked together by a straight line, the pivot 112 may be a simple pivot which provides rotation about a single axis. The third position PRC lies on a route travelled by the actuator between the first position PRA and the second position PRB.

Figure 15:
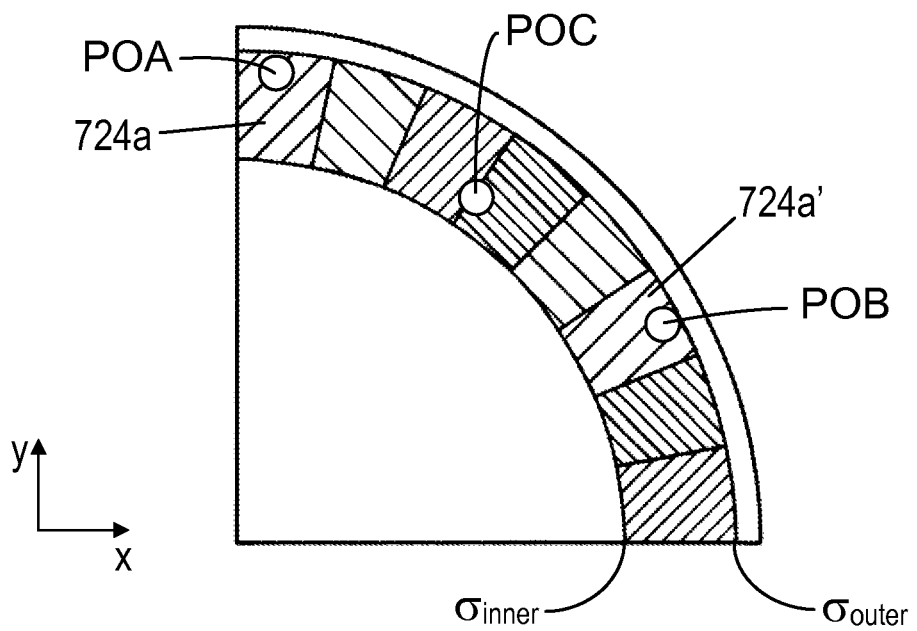
FIG. 15 shows how a first quadrant of an illumination mode may be adjusted using the actuator of FIG. 14.

FIG. 15 shows part of the pupil plane of the lithographic apparatus in which the illumination mode is formed (FIG. 15 corresponds generally with FIG. 7). In FIG. 15, it has been assumed that the mirror 110 directs radiation to a relatively small portion of two locations 724a, 724a'. A portion of a location traversed by radiation directed by the mirror 110 is indicated by a circle. When the mirror 110 is in the first orientation, then radiation is directed towards a portion POA of a first location 724a. When the mirror 110 is in the second orientation, then radiation is directed towards a portion POB of a second location 724*a*'. When the mirror 110 is in the third orientation, then the radiation is directed towards a portion POC of an location midway between the first and second locations 724*a*, 724*a*'. As described further above, a secondary reflective element provided at portion POC may be oriented such that it directs radiation away from the patterning device MA (see FIG. 2).

In a modified arrangement (not illustrated) the middle pole of the yoke may be offset in the x-direction (or the negative x-direction). If this is the case, then the radiation will be directed towards a portion of an location which is between the first and second locations 724*a*, 724*a* but is not midway between them when the mirror 110 is in the third orientation. The degree of offset from the midway position will depend upon the degree of offset of the middle pole of the yoke.

Figure 16:
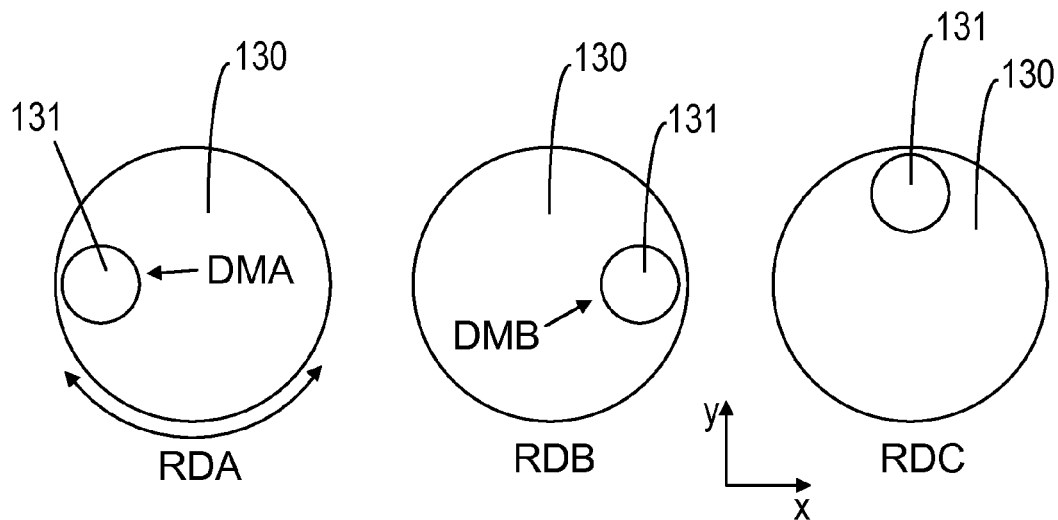
FIG. 16 shows part of a modified actuator viewed from above.

FIG. 16 shows, viewed from above, part of an embodiment of the invention which comprises a rotatable disk 130 provided with a magnet 131 (hereafter referred to as the disk magnet 131). The rotatable disk 130 is rotatable through 180°, from orientation RDA to orientation RDB, as indicated by the double headed arrow. Rotation of the rotatable disk 130 through 180° moves the disk magnet 131 from position DMA to position DMB.

Referring to FIG. 10 in combination with FIG. 16, the first and second fixed magnets 114, 115, first and second coils 117, 118, and yoke 116 may be removed from beneath the stainless steel sheet 120 and replaced by the rotatable disk 130 and disk magnet 131. Flat surfaces of the rotatable disk may be parallel to the stainless steel sheet 120.

The poles of the disk magnet 131 and the rod magnet 113 may be arranged such that the disk magnet 131 and rod magnet 113 are attracted to each other. The attraction may be sufficiently strong to overcome the resilience of the rod 111, and consequently the rod magnet 113 will move towards the disk magnet.

When the rotatable disk 130 is in the first orientation RDA, the rod magnet 113 will be pulled towards the disk magnet 131 until an end stop (not shown) prevents further movement of the rod 111. The disk magnet 131 thus holds the rod 111 against the end stop in its first position PRA (the first position is determined by the end stop).

When the rotatable disk 130 is in the second orientation RDB, the rod magnet 113 is pulled towards the disk magnet 131 until an end stop (not shown) prevents further movement of the rod 111. The disk magnet thus holds the rod 111 against the end stop in its second position PRB (the second position is determined by the end stop).

When the rotatable disk 130 is in the third orientation RDC, the rod magnet 113 is again pulled towards the disk magnet 131. There is no end stop to limit movement of the rod 111. The rod magnet 113 thus moves towards the disk magnet 131 until the net force acting on the rod 111 is zero (where net force takes into account magnetic attraction and the resilience of the rod 111). An intermediate stop may be included which limits movement of the rod 111 in the y-direction for example. Intermediate stops may be included in other embodiments of the invention.

The third orientation RDC of the rotatable disk 130 lies on a route travelled by the rotatable disk between the first orientation RDA and the second orientation RDB. Similarly, the third position PRC of the rod 111 lies on a route travelled by the rod between the first position PRA and the second position PRB.

In order to allow the rod 111 to move to the third position PRC, the pivot which holds the rod may allow the rod 111 to rotate in two different directions. Referring to FIG. 10, the pivot 112 may allow the rod to rotate as shown by the double headed arrows, and may also allow the rod to rotate out of the plane of FIG. 10.

Figure 17:
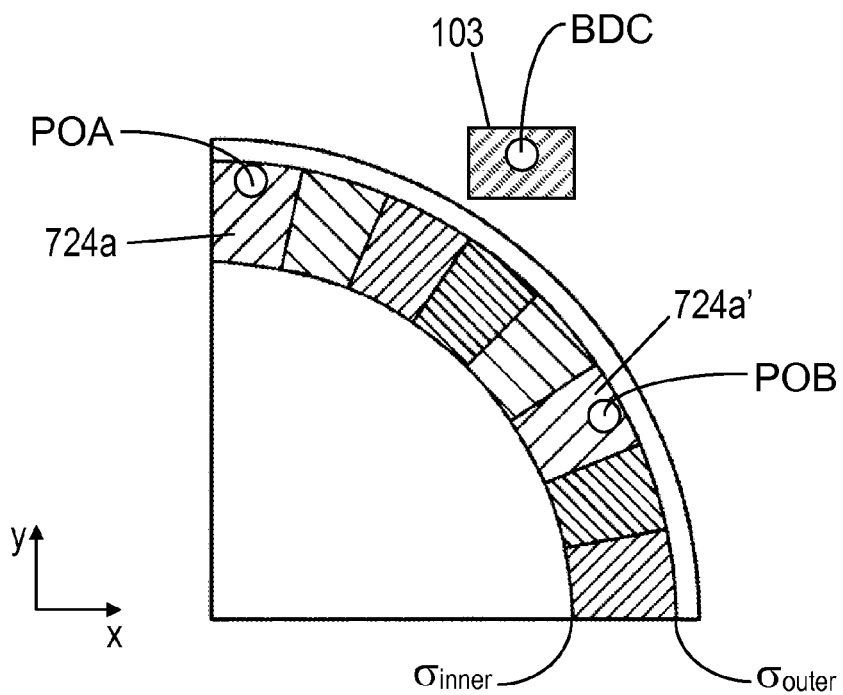
FIG. 17 shows how a first quadrant of an illumination mode may be adjusted using the modified actuator of FIG. 16.

FIG. 17 shows the same part of the pupil plane of the lithographic apparatus that is shown in FIG. 15. A portion of a location traversed by radiation directed by the mirror 110 is again indicated by a circle. When the rod 111 is in position PRA, as determined by the rotatable disk 130 of FIG. 16, then radiation is directed towards a portion POA of a first location 724*a*. When the rod 111 is in position PRB, as determined by the rotatable disk 130 of FIG. 16, then radiation is directed towards a portion POB of a second location 724*a*'. When the rod 111 is in position PRC, as determined by the rotatable disk 130 of FIG. 16, then radiation is directed away from the illumination mode towards a portion BDC of a beam dump 103. The radiation therefore does not form part of any illumination mode (the active illumination mode has been adjusted).

The rotatable disk shown in FIG. 16 rotates clockwise from the first orientation RDA to the second orientation RDB. However, the rotatable disk could rotate anticlockwise from the first orientation RDA to the second orientation RDB. If this were to be the case, then in the third orientation (not shown) of the rotatable disk, the disk magnet 131 would be on an opposite side to that shown in FIG. 16. As a consequence of this, when the rotatable disk 130 was in the third orientation, radiation would be directed towards the center of the illumination mode. The radiation may for example be directed towards a beam dump (not shown but schematically illustrated in FIG. 9) provided at the center of the illumination mode.

End stops (not shown) may be used to prevent the rotatable disk 130 from rotating beyond orientation RDA and from rotating beyond orientation RDB.

The rotatable disk 130 may be rotated by a motor (not shown). To move the rotatable disk 130 to the third orientation RDC, the motor may be energized for a period of time which is sufficient to rotate the disk to the third orientation, and may then be de-energized. The motor may include gearing which is sufficiently high to retain the rotatable disk 130 in the third orientation once the motor has been de-energized. The motor may be a stepper motor.

Although the description of FIGS. 16 and 17 refers to the rod magnet 113 and disk magnet 131 exerting attractive force on each other, they may exert repulsive force on each other. The same may apply to other embodiments of the invention.

As is described above in relation to FIGS. 10 to 17, an actuator may be used to move a mirror 110, for example the primary reflective element 22*a*, between first, second and third orientations such that it directs radiation towards three different portions POA, POB, and POC of different locations in a pupil plane. In some instances, for example as shown in FIG. 15 referring to locations associated with the primary reflective element 22*a*, the third position of the actuator causes radiation to be directed towards a portion POC which lies on a secondary reflective element, the secondary reflective element (pupil facet mirror) being oriented such that radiation received from field facet mirror 22*a* and reflected from that pupil facet mirror does not form part of the illumination modes formed when the associated primary reflective element 22*a* is in either its first or second orientation wherein it irradiates the first or second location 724*a* or 724*a* respectively. The pupil facet mirror may reflect the radiation away from the patterning device MA (see FIG. 2).

The third position of the actuator which determines the orientation of the primary reflective element may be imprecisely determined. This may arise for example from engineering tolerances in the construction of the actuator. Consequently, the radiation directed by the field facet mirror may be directed towards one of several different pupil facet mirrors when the actuator is in its third position (i.e. it may not be known which pupil facet mirror receives the radiation).

As a result of the imprecise determination of the third position at which radiation is incident upon the pupil facet mirrors, a secondary reflective element may receive radiation from several different field facet mirrors. Where this occurs, the pupil facet mirror may be heated to a temperature which is sufficiently high to damage the mirror (for example by causing layers of the mirrors to fuse together). This is undesirable, since it may then be necessary to replace the mirror.

In an embodiment of the invention, a calibration is used to determine more precisely the location at which radiation is incident upon the pupil facet mirrors when the actuator is in the third position. The embodiment of the invention will be described in relation to an actuator which is powered by a stepper motor, although it will be appreciated that the invention may be embodied using other forms of motor.

Referring to FIG. 15, a stepper motor may require 100 steps to move an actuator (and associated field facet mirror) from a first position which directs radiation towards the first location portion POA to a second position which directs radiation towards the second location portion POB. Calibration may be performed using an image sensor (not shown) which may be located in a field plane of the illumination system. The image sensor may for example be provided at the location where the patterning device MA (see FIG. 2) is provided during operation of the lithographic apparatus. The image sensor is configured to detect radiation which is directed by field facet mirrors towards pupil facet mirrors, and is reflected by the pupil facet mirrors towards the image sensor. The image sensor detects the intensity distribution at the pupil plane of radiation that will be reflected to the field plane (e.g. reflected to the patterning device MA). This intensity distribution corresponds to the angular distribution in a field plane (e.g. in the plane of the patterning device MA or in the plane of the substrate W).

The stepper motor is stepped through 100 steps from the first position to the second position. After each step, radiation which is reflected from the pupil facet mirrors to the image sensor is detected. In some instances the orientations of the pupil facet mirrors may be such that no radiation is incident upon the image sensor. However, in other instances radiation will be incident upon the image sensor. Interpolation may be used to estimate missing data points. Thus, a relationship may be established between the number of steps of the stepper motor (i.e. the position of the stepper motor) and the pupil plane locations which receive radiation reflected by the field facet mirror.

The calibration links each step of the stepper motor with a location in the pupil plane which receives radiation reflected by the field facet mirror. This allows a more precise identification of the pupil facet mirror which receives radiation from the field facet mirror when the stepper motor is in the third position. It also allows the third position to be selected such that a desired pupil facet mirror receives radiation from the field facet mirror.

In the example where the stepper motor steps through 100 steps between the first position to the second position, in an uncalibrated system the third position may be selected to be 50 steps from the first position. Once calibration has been performed, it may be determined using the results of the calibration that 40 steps is the preferred number of steps, since it directs the radiation at a desired pupil facet mirror.

Although the above embodiment is described in relation to a stepper motor which steps through 100 steps between the first position and the third position, embodiments of the invention may use a stepper motor with any suitable number of steps. Embodiments of the invention may use any other suitable motor or actuating apparatus.

The calibration allows a more accurate determination of the third position at which radiation is incident at the pupil plane than would otherwise be the case. This allows the orientations of field facet mirrors to be selected such that pupil facet mirrors do not receive radiation with sufficient energy to damage the pupil facet mirrors. For example, the orientations of the field facet mirrors may be selected such that pupil facet mirrors do not receive radiation from more than one field facet mirror. In an alternative example, the orientations of the field facet mirrors may be selected such that the pupil facet mirrors receive radiation from up to two field facet mirrors but not more than two field facet mirrors. In a further alternative example, the orientations of the field facet mirrors may be selected such that the pupil facet mirrors may receive radiation from some other number of field facet mirrors but not more than that number of field facet mirrors.

Embodiments of the invention may allow the orientation of a field facet mirror to be determined with sufficient accuracy that it may be used to direct radiation towards a specific pupil facet mirror when in the third orientation. Embodiments of the invention may have a slightly lower accuracy, for example such that the orientation of a field facet mirror is determined sufficiently accurately to direct the radiation towards a specific pupil facet mirror with a tolerance of plus or minus one pupil facet mirror (i.e. radiation may be incident upon a desired pupil facet mirror or may be incident upon pupil facet mirrors which lie next to the desired pupil facet mirror).

The calibration provided by embodiments of the invention may allow more field facet mirrors to be held in the third orientation than would be the case if the calibration had not been performed.

The calibration may be performed in an automated fashion. For example, a calibration apparatus may comprise a controller which is configured to provide an output signal which moves the actuator to plurality of positions, the image sensor, and a memory configured to record the relationship between the output signal of the controller and the output of the image sensor.

The calibration may be performed simultaneously for a plurality of field facet mirrors.

Figure 18:
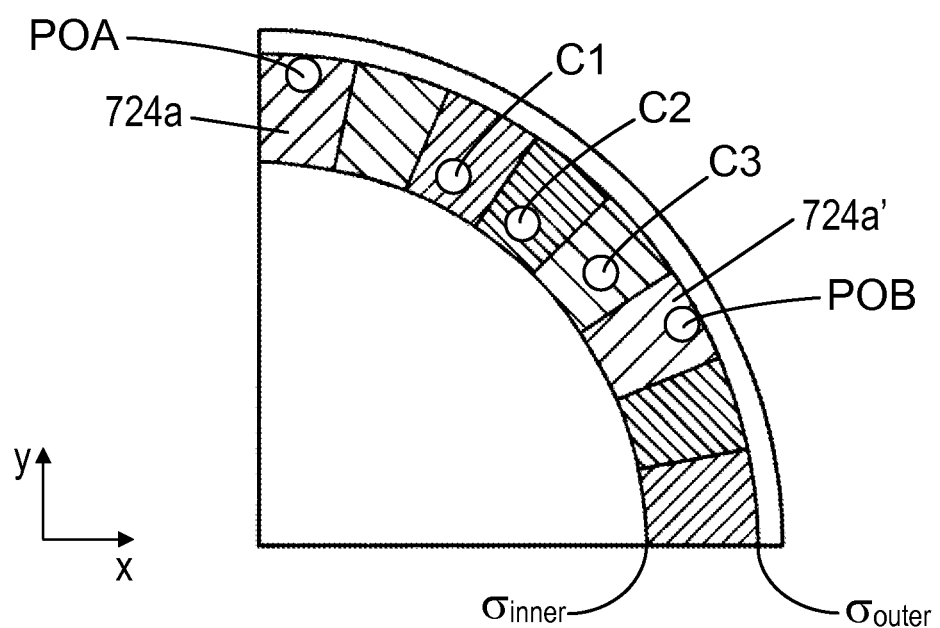
FIG. 18 shows how a first quadrant of an illumination mode may be adjusted using an alternative modified actuator.

In an embodiment of the invention, the third position of the actuator may be modulated periodically in order to spread, between two or more pupil facet mirrors, heat generated by radiation reflected from a field facet mirror. Referring to FIG. 18, the actuator may be modulated such that the field facet mirror moves between an orientation which directs radiation towards the third location C1 (referred to hereafter as the first intermediate location C1) and a fourth location C2 (referred to hereafter as the second intermediate location C2). The modulation thus moves the radiation between two different pupil facet mirrors, thereby halving the amount of heat which is deposited each of the pupil facet mirrors. This reduction of the heat may avoid the mirrors being damaged due to overheating.

The thermal characteristics of the pupil facet mirrors may be used to determine a maximum time that radiation may be directed at a single pupil facet mirror. Once the maximum time has been determined, the field facet mirror may be modulated at a rate which is sufficiently fast that the maximum time is not reached or exceeded. The modulation may take place for example once every minute.

In an embodiment, the orientation of the field facet mirror may be modulated between three intermediate positions rather than two intermediate positions. For example, the orientation of the field facet mirror may be modulated such that three intermediate locations C1, C2, C3 are illuminated, as shown in FIG. 18. This reduces the heat incident upon each pupil facet mirror to one third of the heat that would be incident in the absence of the modulation. The modulation may be used to direct radiation to any suitable number of pupil facet mirrors.

The pupil facet mirrors which receive radiation as a result of the modulation may be selected such that they do not direct the radiation into the illumination mode. This may be achieved for example by configuring the field facet mirrors and pupil facet mirrors such that two or more neighbouring pupil facet mirrors exist which will direct radiation out of the illumination mode when they receive radiation from a particular field facet mirror.

In a further arrangement of the invention (not illustrated), a motor may be used to move a magnet between first and second positions, thereby pulling (or pushing) the rod magnet between first and second positions. To move the rod magnet to a third position which is between the first and second positions, the motor may be energized for a period of time which is sufficient to move the motor-actuated magnet to a point midway between the first and second positions, and may then be de-energized. The motor may include gearing which is sufficiently high to retain the motor-actuated magnet in the third orientation once the motor has been de-energized. The motor and magnet may cause the rod magnet to move through a linear route or a nonlinear route. The motor may be a rotary motor which is arranged to drive a crank shaft on which the magnet has been mounted. Alternatively, the motor may be a rotary motor which drives a cog, which in turn drives a toothed bar (rack) to which the magnet is connected.

In a further arrangement of the invention (not illustrated), a bimetal motor is used to move the rod between first and second positions. The bimetal motor may comprise a bimetal strip provided adjacent to one side of the rod and a bimetal strip provided adjacent to an opposite side of the rod. Each bimetal strip may be configured such it bends towards the rod when current is passed through it, the degree of bending depending upon the amount of current passed through the rod. The bimetal strip pushes against the rod, thereby causing the rod to rotate about a pivot. The bimetal strips may thus be used to control the orientation of the rod. The bimetal strips may be used to move the rod between first and second positions, and also to a third position which lies on the route travelled by the rod between the first and second positions. The rod may be resiliently biased for example, such that if neither bimetal strip presses against it, then it moves to the third position.

In a further arrangement of the invention (not illustrated), a bimetal motor is used to move a magnet which in turn is used to move the rod between first and second positions. The bimetal motor may comprise a bimetal strip having a magnet provided at one end. The bimetal strip may be configured such that it moves the magnet between first and second positions in response to current being applied to the bimetal strip, thereby moving the rod magnet between first and second positions. The bimetal strip may be used to move the magnet (and thus the rod magnet) to a third position which lies on the route travelled by the rod between the first and second positions.

The above described embodiments have referred to a stainless steel sheet 120. The stainless steel sheet acts as a shield against a gaseous or vacuum environment which surrounds the rod 111 and mirror 110. Stainless steel is given as an example. The stainless steel sheet may be replaced by a sheet of suitable non-magnetic shielding material.

The above described embodiments have referred to a mirror 110. The mirror 110 is merely an example of a reflective element. Any suitable reflective element may be used.

The mirror 110 and associated actuator 109 described above may be one of a plurality of primary reflective elements and associated actuators. Electrically powered parts of the actuators may be located within a box (e.g. a vacuum sealed box). Where this is the case, the number of wires required to pass into the box may be reduced by multiplexing a control signal which passes into the box. A demultiplexer may be provided inside the box. The demultiplexer may be configured to receive the multiplexed control signal, and convert that signal into a plurality of signals which may be used to control the primary reflective elements.

The above description of the invention has referred to a reflective illumination system (e.g. comprising part of an EUV lithographic apparatus). However, the invention may be provided in an illumination system which comprises refractive elements. The invention may for example be provided in a DUV lithographic apparatus. Refractive optical components may be provided in the illumination system pupil plane instead of or in addition to reflective optical components. Cartesian coordinates are shown on some of the Figures. This is to facilitate description of the Figures, and is not intended to mean that any parts of the invention must have a particular orientation.

Although the described embodiment of the invention refers to an illumination system of a lithographic apparatus, an embodiment of the invention may be provided at any suitable location in a lithographic apparatus.

Although the array of reflective elements is described in the context of a lithographic apparatus, it may be provided in other apparatus.

While specific embodiments of the invention have been described above, it will be appreciated that the invention may be practiced otherwise than as described. The description is not intended to limit the invention.

The preferred features of the invention are applicable to all aspects of the invention and may be used in any combination.

The invention claimed is:

1. An illumination system comprising a plurality of moveable reflective elements and associated actuators configured to form an illumination mode, wherein one or more of the actuators is arranged to move between first, second and third positions, wherein the third position of the actuator lies on a route travelled by the actuator between the first and second positions, and so move an associated moveable reflective element between first, second and third orientations, the first and second orientations being such that radiation reflected from the moveable reflective element forms part of the illumination mode, and the third orientation being such that radiation reflected from the moveable reflective element does not form part of the illumination mode.

2. The illumination system of claim 1, wherein the actuator is configured to remain in any of the first, second or third positions without power being supplied to the actuator.

3. The illumination system of claim 1, wherein the first and second positions of the actuator are determined by end stops.

4. The illumination system of claim 1, wherein the third position of the actuator is determined by an intermediate stop.

5. The illumination system of claim 1, wherein the illumination system further comprises a beam dump configured to receive radiation that does not form part of the illumination mode.

6. The illumination system of claim 1, wherein the first, second and third positions of the actuator lie on a route which is a straight line.

7. The illumination system of claim 1, wherein the first, second and third positions of the actuator lie on a route which is not a straight line.

8. The illumination system of claim 1, wherein the actuator comprises:
a pivotally mounted rod upon which the moveable reflective element is mounted;
a magnet provided at one end of the rod; and
first and second magnets provided in a yoke, the first and second magnets and yoke configured to provide a magnetic field that defines stable first, second and third positions of the rod magnet and the rod.

9. The illumination system of claim 8, wherein the actuator further comprises a first coil associated with the first magnet and a second coil associated with the second magnet, wherein the first coil or the second coil is configured to be energized to modify force acting on the rod magnet.

10. The illumination system of claim 8, wherein the third position corresponds to a pole of the yoke.

11. The illumination system of claim 1, wherein the actuator is resiliently biased towards the third position.

12. The illumination system of claim 1, wherein the actuator is configured to modulate between the third position and a fourth position, the fourth position being such that radiation reflected from the moveable reflective element does not form part of the illumination mode.

13. A lithographic apparatus comprising:
an illumination system comprising a plurality of moveable reflective elements and associated actuators configured to form an illumination mode, wherein one or more of the actuators is arranged to move between first, second and third positions, wherein the third position of the actuator lies on a route travelled by the actuator between the first and second positions, and so move an associated moveable reflective element between first, second and third orientations, the first and second orientations being such that radiation reflected from the moveable reflective element forms part of the illumination mode, and the third orientation being such that radiation reflected from the moveable reflective element does not form part of the illumination mode.

14. The lithographic apparatus of claim 13, further comprising a controller configured to provide an output signal which moves the actuator to plurality of positions, an image sensor, and a memory configured to record a relationship between the output signal of the controller and an output of the image sensor.

15. A method of adjusting an illumination mode formed by a plurality of moveable reflective elements, the method comprising changing the orientation of one or more moveable reflective elements such that radiation reflected from the one or more moveable reflective elements does not form part of the illumination mode, wherein an actuator moves from a first or second position to a third position, wherein the third position of the actuator lies on a route travelled by the actuator between the first and second positions, and so moves one of the moveable reflective elements from a first or second orientation to a third orientation, the first and second orientations being such that radiation reflected from the moveable reflective element forms part of the illumination mode, and the third orientation being such that radiation reflected from the moveable reflective element does not form part of the illumination mode.

16. The method of claim 15, wherein the actuator is configured to remain in the third position without power being supplied to the actuator.

17. The method of claim 15, wherein the reflected radiation which does not form part of the illumination mode is directed towards a beam dump.

18. The method of claim 15, wherein the plurality of moveable reflective elements comprise part of a lithographic apparatus, and the reflected radiation which does not form part of the illumination mode is directed towards a surface which does not reflected the radiation towards a patterning device of the lithographic apparatus.

19. The method of claim 15, wherein the actuator modulates from the third position to a fourth position, and so moves one of the moveable reflective elements from the third orientation to a fourth orientation, the fourth orientation being such that radiation reflected from the moveable reflective element does not form part of the illumination mode.

* * * * *